(12) United States Patent
Zhang

(10) Patent No.: US 8,479,363 B2
(45) Date of Patent: Jul. 9, 2013

(54) METHODS FOR WAFER LEVEL TRIMMING OF ACOUSTICALLY COUPLED RESONATOR FILTER

(76) Inventor: Hao Zhang, Zhuhai (CN)

( * ) Notice: Subject to any disclaimer, the term of this patent is extended or adjusted under 35 U.S.C. 154(b) by 650 days.

(21) Appl. No.: 12/777,842

(22) Filed: May 11, 2010

(65) Prior Publication Data

US 2011/0277286 A1 Nov. 17, 2011

(51) Int. Cl.
*H01L 41/22* (2013.01)
*H01L 41/00* (2013.01)
*H04R 17/00* (2006.01)
*H02N 2/00* (2006.01)

(52) U.S. Cl.
USPC .................................... 29/25.35; 310/311

(58) Field of Classification Search
USPC ................. 29/25.35; 310/311, 316.01, 317
See application file for complete search history.

(56) References Cited

U.S. PATENT DOCUMENTS

| | | | | |
|---|---|---|---|---|
| 4,172,253 A | * | 10/1979 | Hermans | 367/94 |
| 4,638,536 A | * | 1/1987 | Vig | 29/25.35 |
| 5,789,845 A | * | 8/1998 | Wadaka et al. | 310/334 |
| 6,051,907 A | * | 4/2000 | Ylilammi | 310/312 |
| 6,081,171 A | * | 6/2000 | Ella | 333/189 |
| 6,111,341 A | * | 8/2000 | Hirama | 310/365 |
| 6,307,447 B1 | * | 10/2001 | Barber et al. | 333/189 |
| 6,462,460 B1 | * | 10/2002 | Tikka et al. | 310/312 |
| 6,657,363 B1 | * | 12/2003 | Aigner | 310/324 |
| 6,720,844 B1 | * | 4/2004 | Lakin | 333/189 |
| 6,933,807 B2 | * | 8/2005 | Marksteiner et al. | 333/187 |
| 7,148,604 B2 | * | 12/2006 | Inoue et al. | 310/322 |
| 7,535,324 B2 | * | 5/2009 | Fattinger et al. | 333/189 |
| 2001/0038255 A1 | * | 11/2001 | Wadaka et al. | 310/313 R |
| 2004/0140869 A1 | * | 7/2004 | Marksteiner et al. | 333/189 |
| 2004/0201305 A1 | * | 10/2004 | Aigner et al. | 310/311 |
| 2004/0212459 A1 | * | 10/2004 | Aigner et al. | 333/197 |
| 2005/0062363 A1 | * | 3/2005 | Aigner et al. | 310/311 |
| 2008/0258845 A1 | * | 10/2008 | Schmidhammer | 333/195 |

\* cited by examiner

*Primary Examiner* — David Angwin
(74) *Attorney, Agent, or Firm* — Morris Manning & Martin LLP; Tim Tingkang Xia, Esq.

(57) ABSTRACT

A method of manufacturing an acoustically coupled device including a stack having a first resonator, a second resonator and a decoupler, the decoupler formed between the first and second resonators, and each resonator having a piezoelectric layer sandwiched between a bottom electrode and a top electrode, includes providing a substrate having a first sacrificial layer formed in or on a selected portion of the substrate, forming the first resonator of a first stack over the sacrificial layer on the selected portion of the substrate and the first resonator of a second stack on the substrate, respectively, such that the first resonators of the first and second stacks are distanced, forming a gap underlying the second stack, performing a measurement on the second stack, trimming the top electrode of the first resonator of the first stack, and forming the second resonator over each of the first and second stacks, respectively.

24 Claims, 20 Drawing Sheets

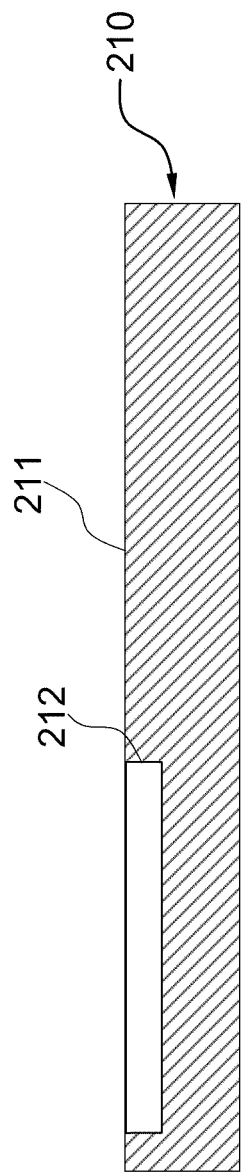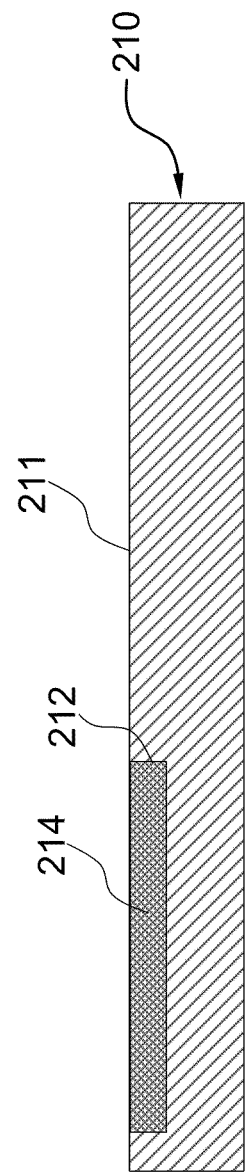

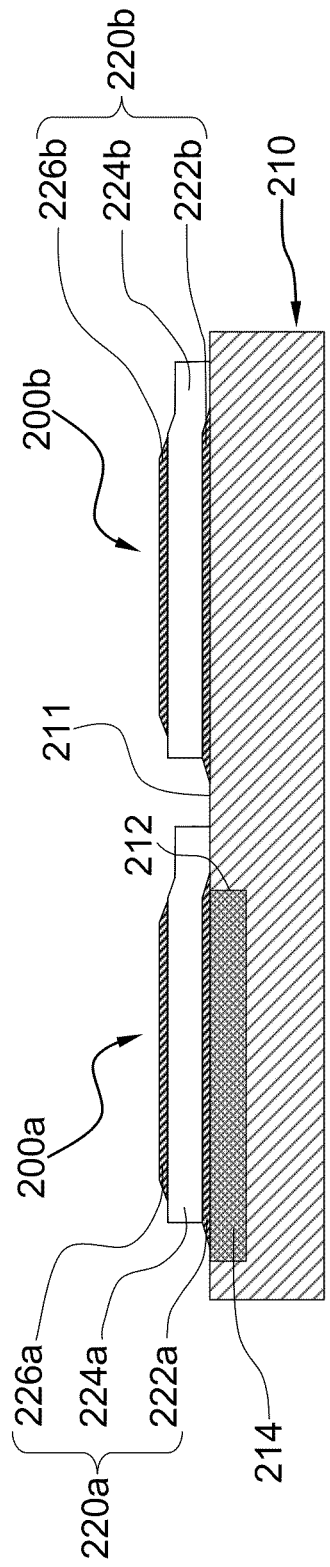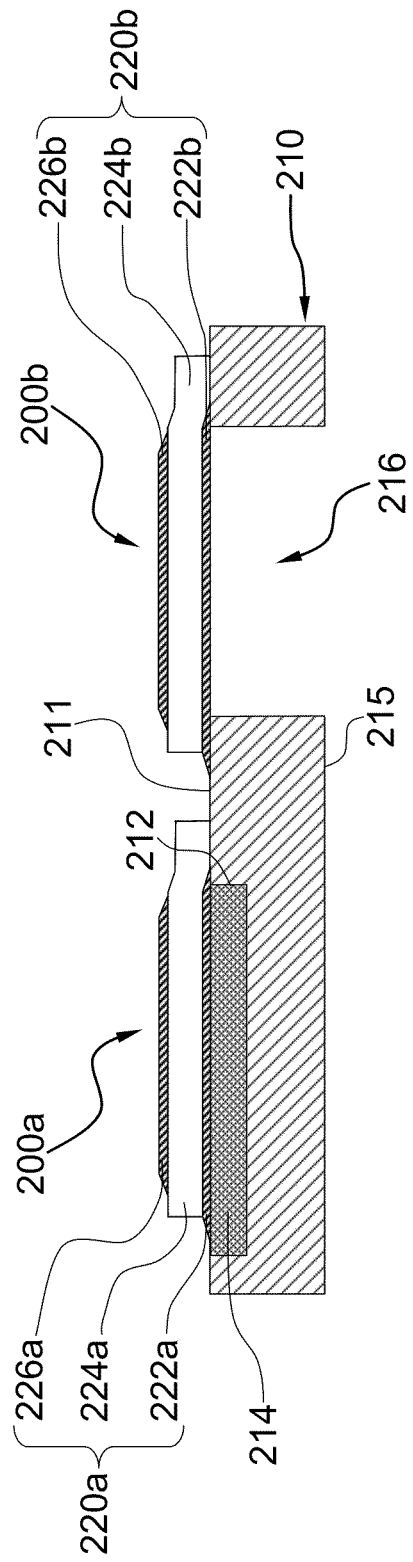

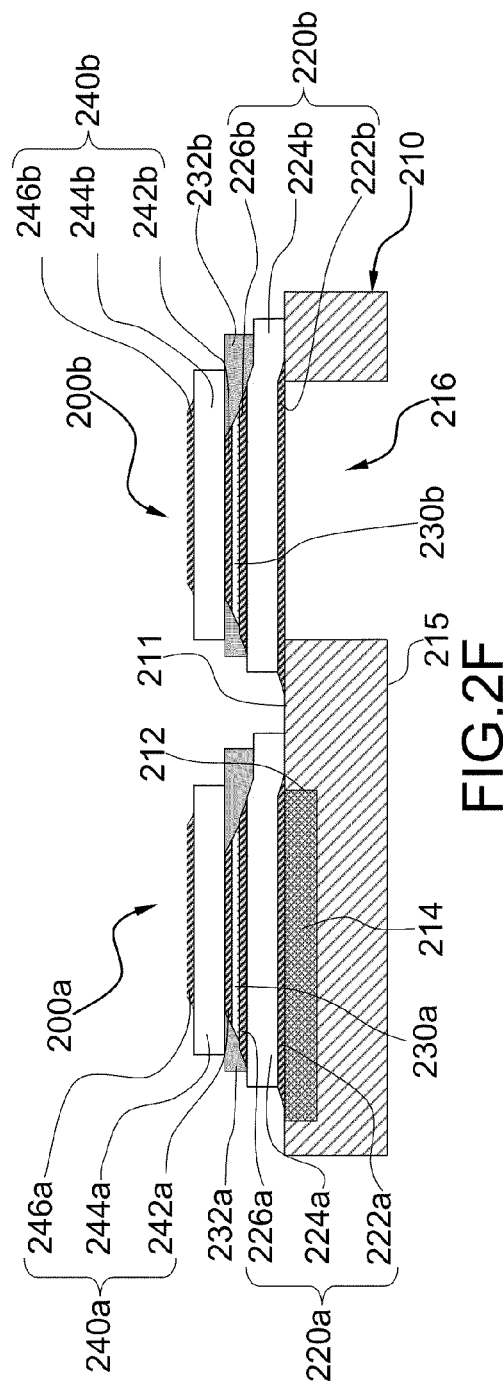
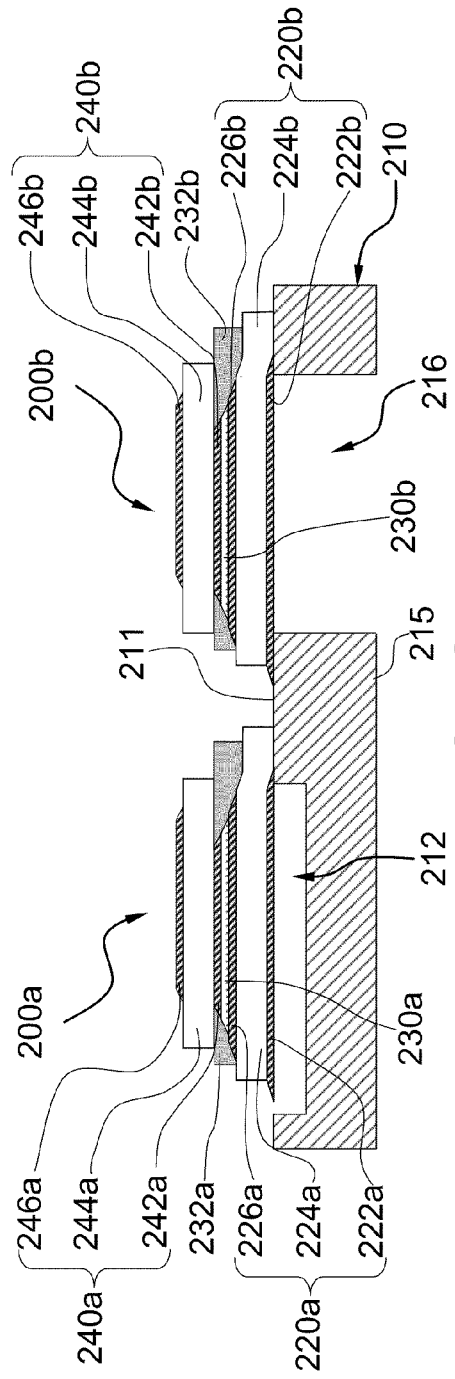

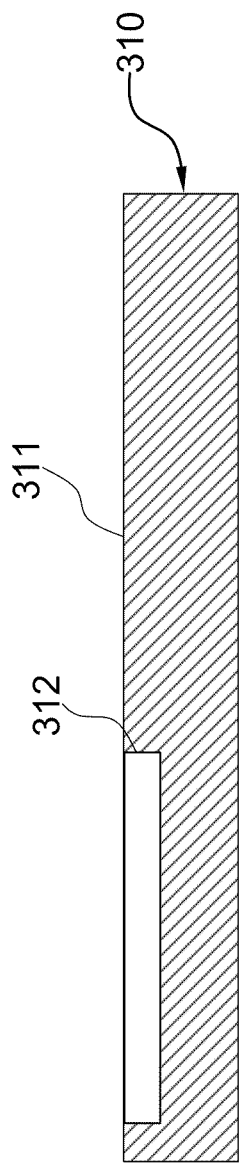
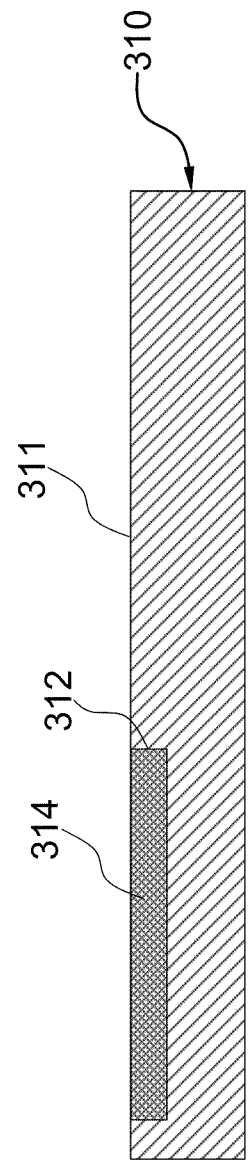

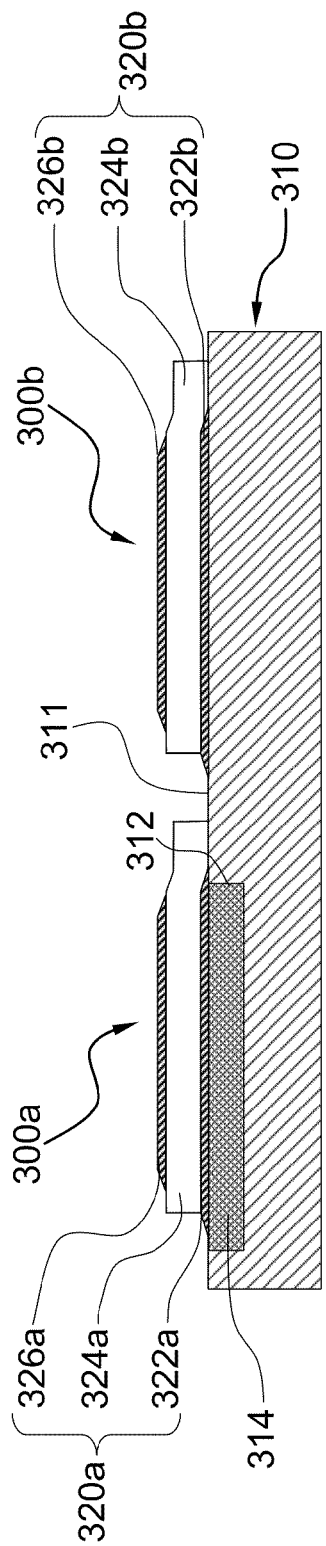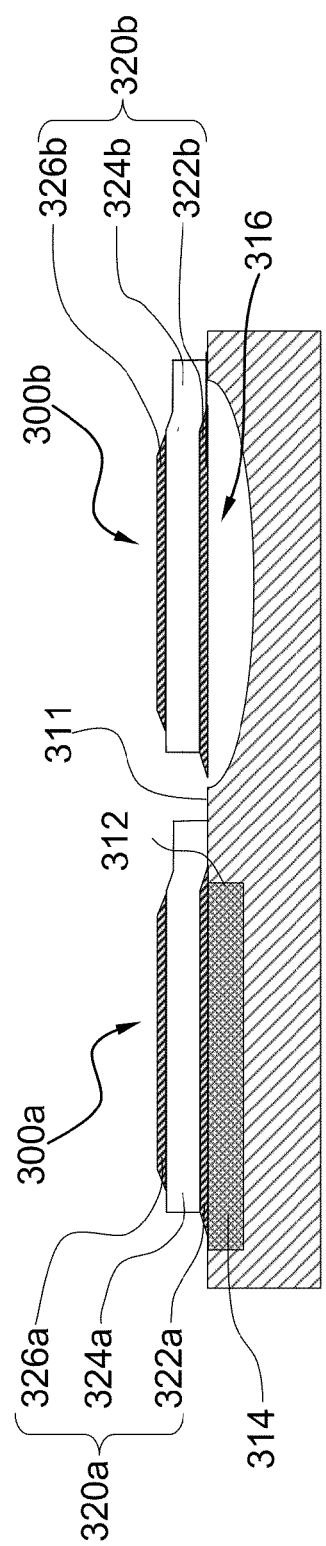

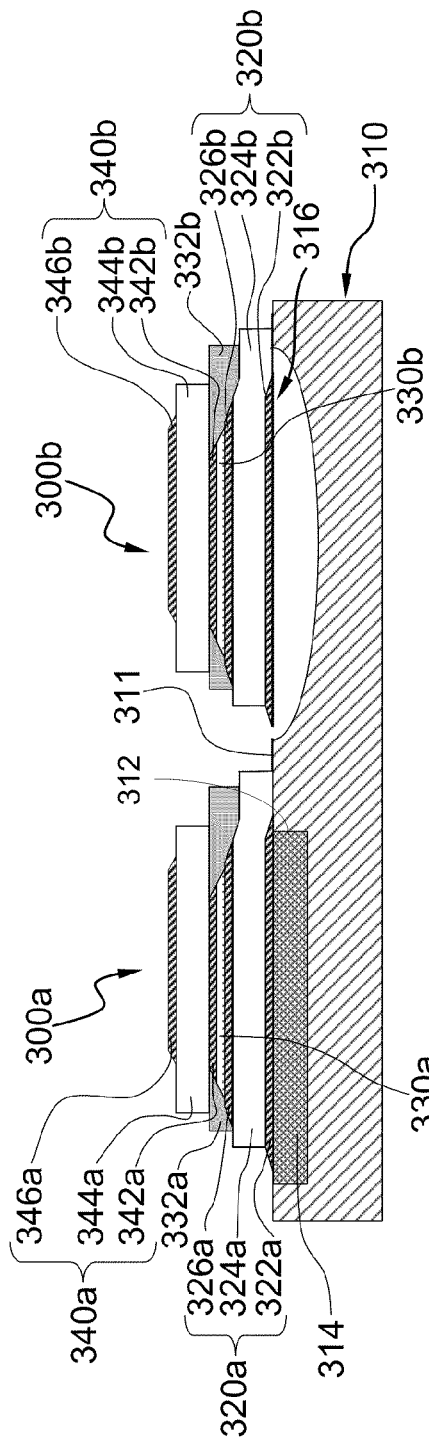
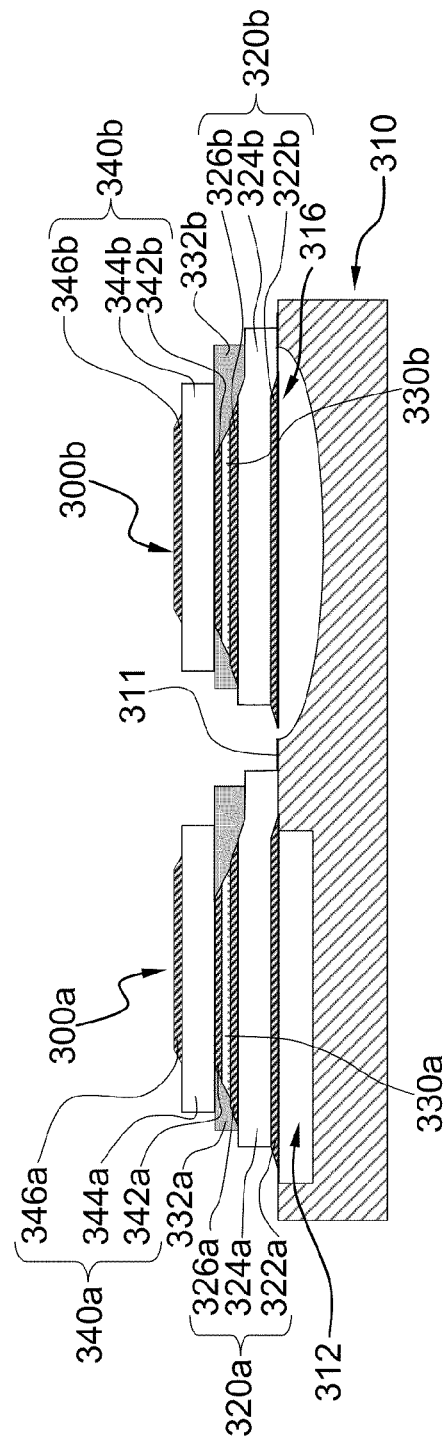

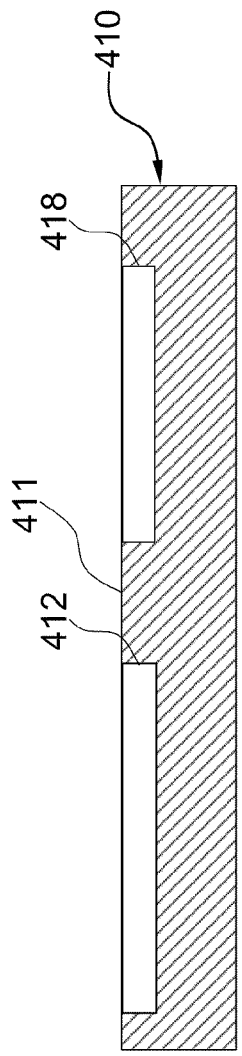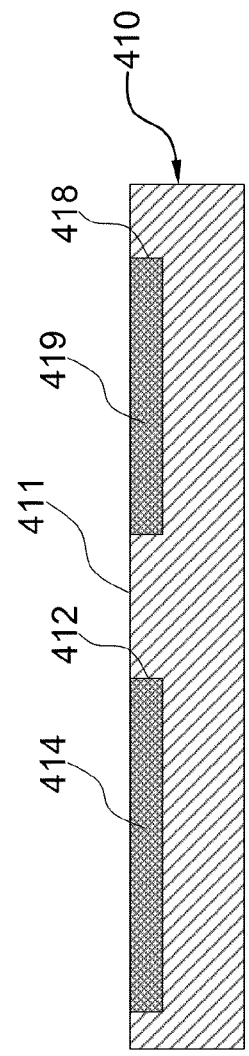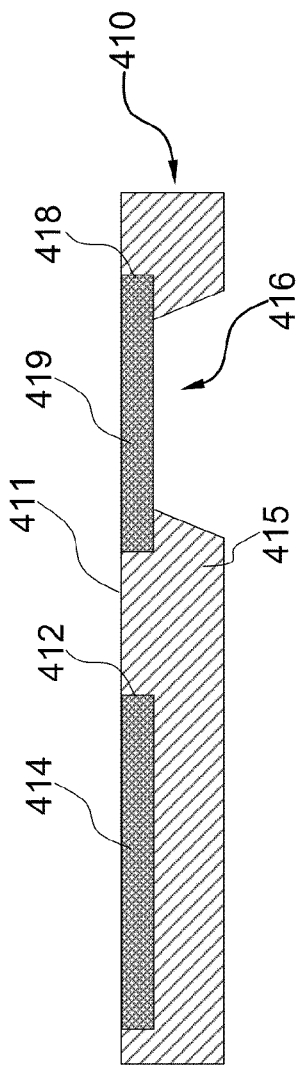

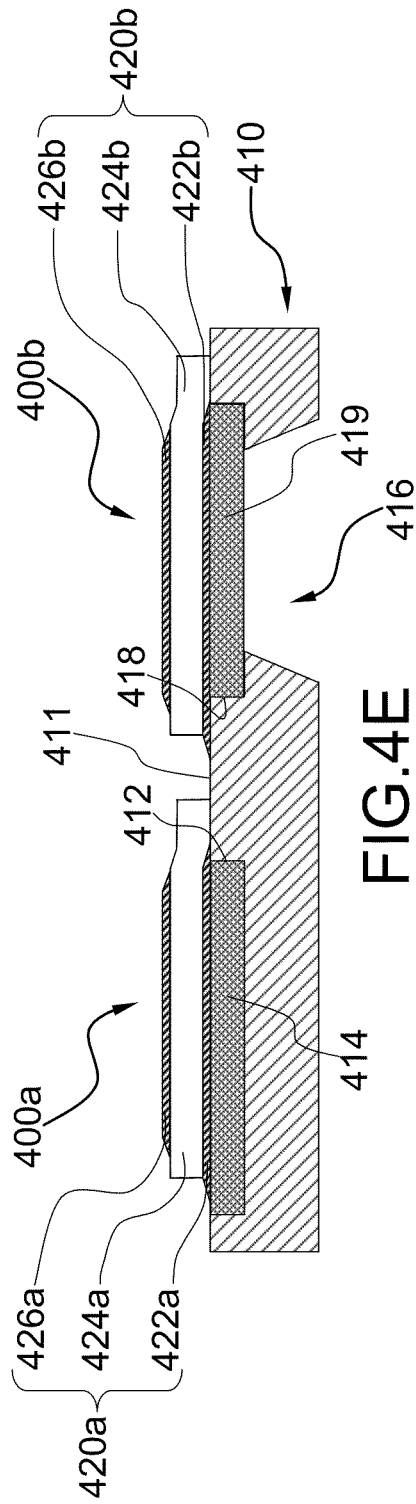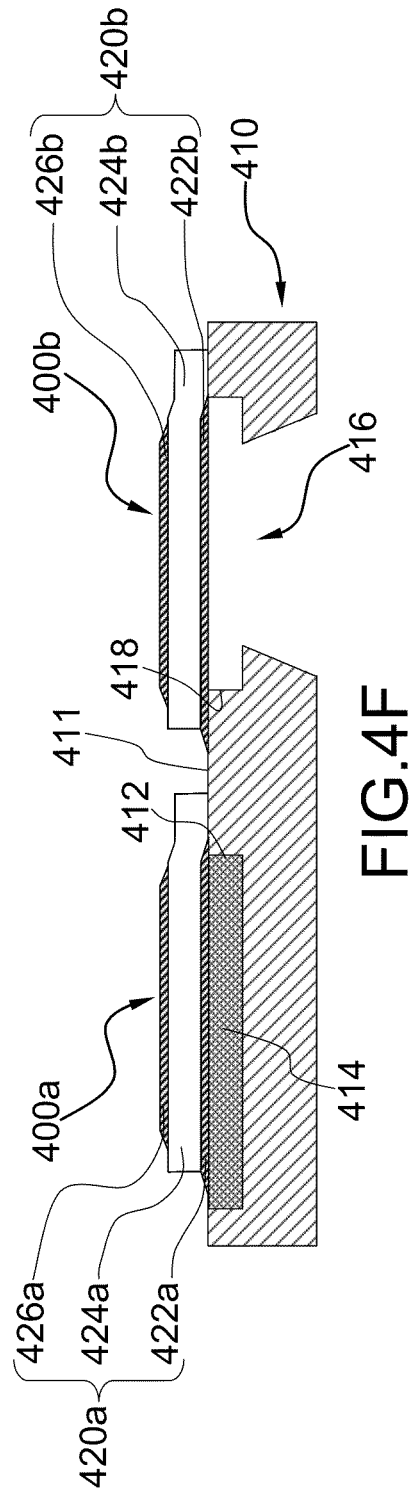

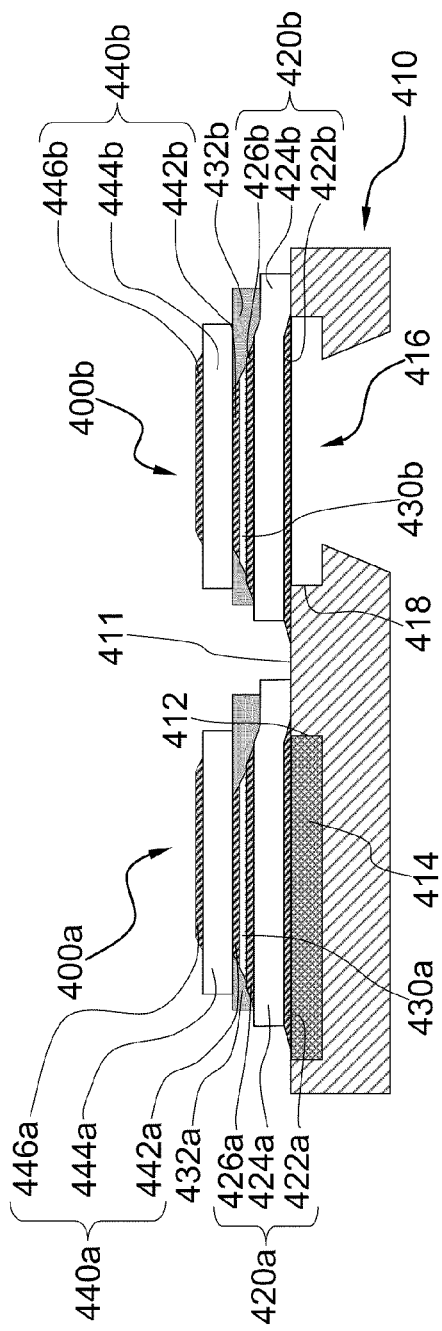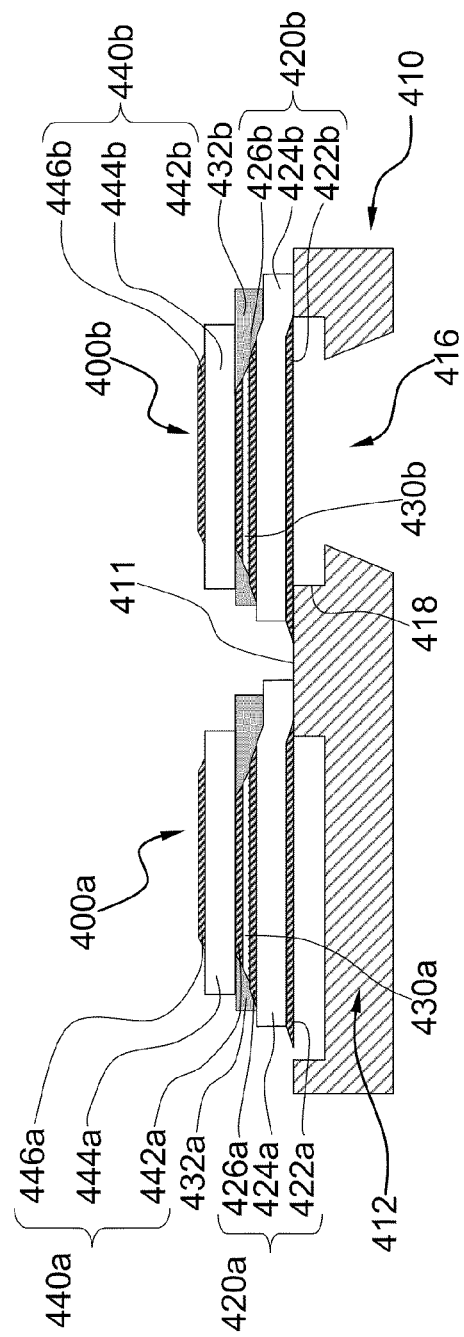
FIG.4G
FIG.4H

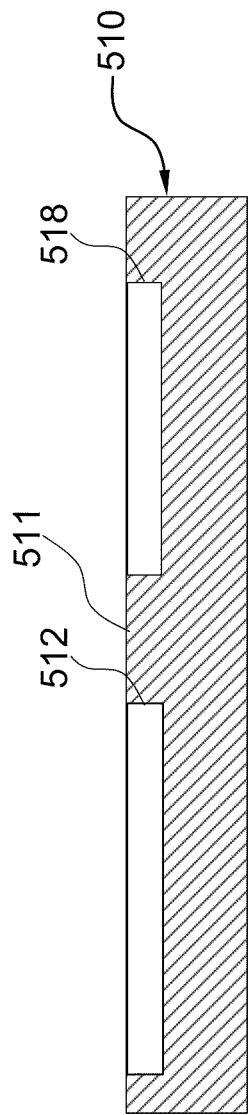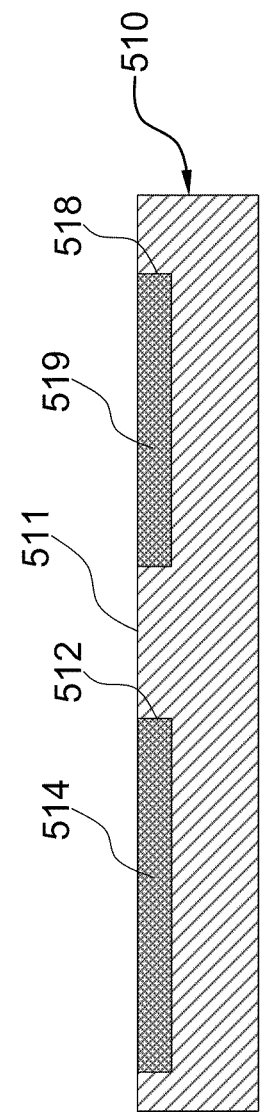

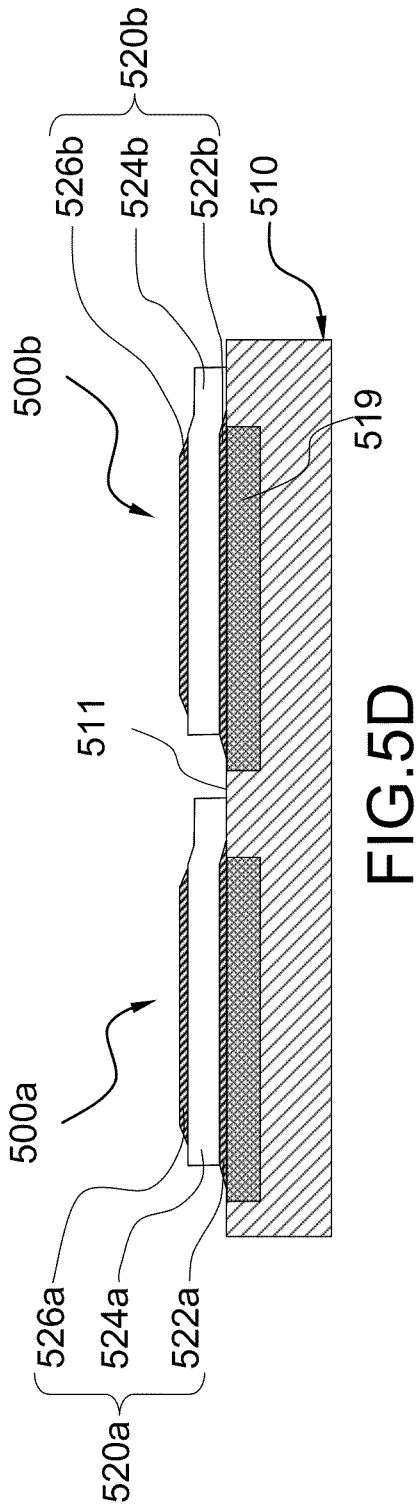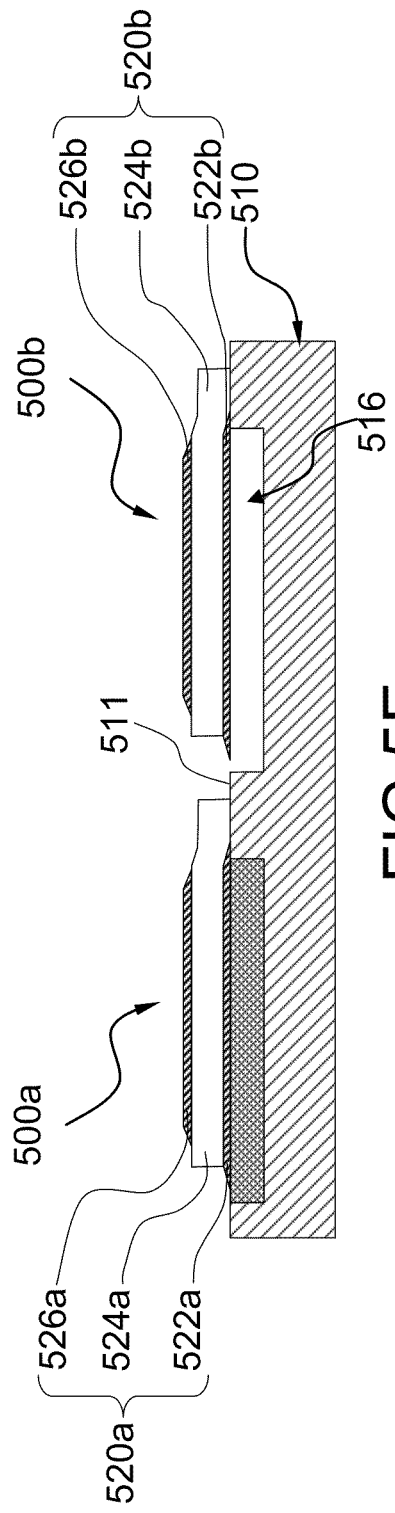

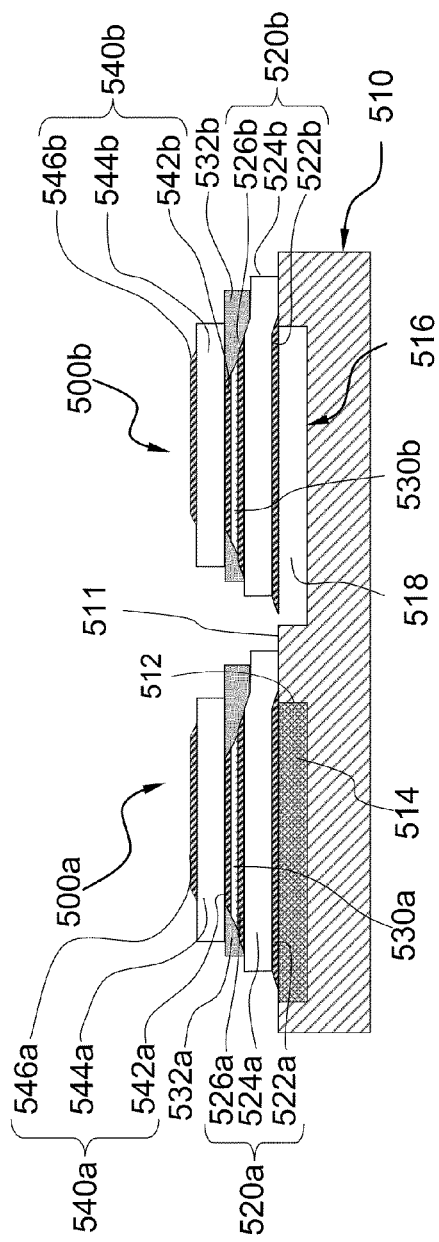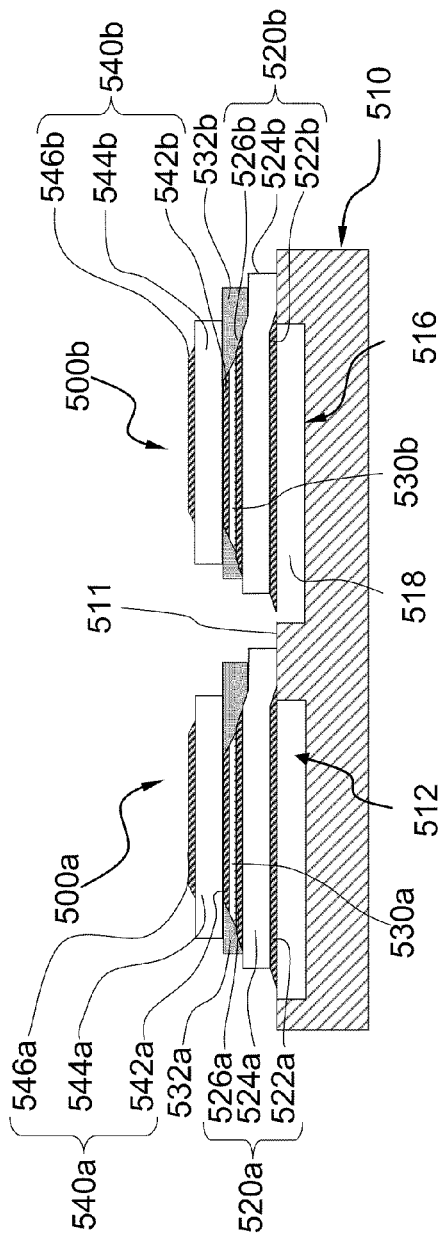

METHODS FOR WAFER LEVEL TRIMMING OF ACOUSTICALLY COUPLED RESONATOR FILTER

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to acoustically coupled devices, and more particularly, to methods for manufacturing an acoustically coupled device that utilizes trimming processes to improve the manufacturing yield of acoustically coupled devices with the desired performance.

BACKGROUND OF THE INVENTION

Radio frequency (RF) filters are key components in any wireless system and as these systems continue to be miniaturized, the pressure on filter technology to shrink as well without compromising performance continues. Handheld systems and their associated volumes have generated strong interest in filter technologies that show promise for lower cost and smaller size. With energy-hungry applications proliferating in modern handsets, low insertion losses extending talk time and battery life also become highly valuable. Band-pass filters that incorporate one or more film bulk acoustic wave (BAW) resonators, known for their high quality factors which directly translate into smaller in-band insertion loss, has recently emerged as an advantageous alternative to filters technology based on both surface acoustic wave (SAW) resonators and ceramic resonators. BAW filters can be classified into two basic categories depending on how the resonators are connected: electrically connected (ladder, lattice or similar configurations) and acoustically coupled (stacked crystal filters (SCF) and coupled resonator filters (CRF)). Acoustically coupled resonators can achieve higher rejection at the far stop-band and wider bandwidth than electrically connected resonators. A CRF can be considered as an extension of a SCF where the acoustic coupling between resonators is less than the one by direct contact in SCF and controlled to achieve higher bandwidths. As shown in FIG. 1, the basic structure of a CRF uses two single BAW resonators vertically arranged one on top of the other and decoupled by means of an acoustic decoupler that can be a single layer or several passive layers of materials having different acoustic impedance. Since the single resonators are replaced by pairs of stacked identical resonators, the number of individual resonators in the CRF filter is small and total area required to implement the filter is reduced, thereby savings in die size and manufacturing costs are realized.

As CMOS for RF transceiver in mobile handsets goes to smaller nodes, the power supply voltage must also shrink. Going differential allows for the same voltage swing, but greatly reduces any common mode signal. Major mobile phone standards like W-CDMA (Wideband Code Division Multiple Access) and GPS (Global Positioning System) front-end module are pushing the need for filter devices featuring single-to-balanced conversion because the LNAs are integrated into RF transceiver ICs and typically have balanced inputs and high impedance. In order to establish BAW devices as a mainstream filter technology the capability for mode conversion become mandatory. BAW filters with a lattice or ladder topology can only provide either single-ended or balanced filters. Therefore, additional efforts are needed, for example, via external baluns, to have the mode conversion option. However, BAW filters with baluns lose some insertion loss and require additional cost and space on the board. CRFs offer complete galvanic isolation between input and output and thus enable to offer BAW filters with mode-conversion (single-ended to balanced) as well as impedance transformation.

The basic structure of BAW resonator and CRF stack is usually suspended as a membrane over an air cavity defined in or on the substrate to completely prevent the acoustic wave generated in the acoustic stack from propagating into the substrate. For example, first, a cavity is etched within the substrate and a layer of sacrificial material is deposited on the surface of the wafer with a thickness sufficient to fill the cavities. The surface of the wafer is then planarized to leave the cavity filled with the sacrificial material. After that, the acoustic resonator stack is fabricated on top of sacrificial layer. Lastly, sacrificial material is etched away from the cavity through exposed via holes to form the air gap underneath CRF.

In manufacturing of BAW filters, the various layers in the resonator device are sequentially formed by thin film deposition and the resonant frequencies in BAW resonators essentially depend on thicknesses of the individual layers (electrode layers, piezoelectric layer, etc.) in the stack. To meet the stringent specification for filtering use in mobile phones, the resonant frequency of the device usually has to be controlled to within a 0.1% tolerance. This means that, if no tuning is used, the thickness of each layer in the device must be controlled in a similar way. It is known that, however, the deposition of thin-film layers by the methods typically used in thin film technology, for example, physical vapor deposition (PVD), chemical vapor deposition (CVD), e-beam evaporation, etc., is extremely difficult to yield a thickness uniformity within such a tight tolerance within the substrate and from substrate to substrate.

Compared to electrically connected BAW filter with single piezoelectric layer, trimming of CRF is much more demanding. A CRF typically includes two piezoelectric layers, four electrodes and one decoupling layer. The first piezoelectric layer is arranged between a first bottom electrode and a first top electrode, a second piezoelectric layer is arranged between a second bottom electrode and a second top electrode. The decoupling layer located between the first top electrode and second bottom electrode controls the degree of acoustic energy coupling between the lower and upper resonator (lower refers typically to the direction towards substrate). Based on the state of the art accuracy (about 0.5% thickness standard deviation) of thin film deposition processes, it is currently not possible to produce CRFs with a reasonable manufacturing yield, if only relying on deposition accuracy. Furthermore, it has been observed that the bandwidth of filter is determined by the acoustic decoupler and the frequency position of lower resonator (arranged between the air cavity and the upper resonator) determines the passband frequency of the filter within very tight limits. The upper resonator has to be tuned appropriately to the frequency of the lower resonator and the trimming of upper resonator alone cannot tune the filter central frequency or bandwidth.

Thus, it is advantageous and desirable to provide a robust and inexpensive manufacturing method to solve the problem associated with thickness non-uniformity in the fabrication of coupled resonator filter devices in particular, on large substrates or wafers.

SUMMARY OF THE INVENTION

In one aspect, the present invention relates a method for manufacturing an acoustically coupled device comprising a stack having a first resonator, a second resonator and a decoupler formed between the first resonator and the second resonator, each of the first and second resonators having a piezoelectric layer sandwiched between a bottom electrode and a top electrode.

In one embodiment, the method includes the steps of providing a substrate having a first sacrificial layer formed in or on a selected portion of the substrate; forming a first resonator of a first stack over the sacrificial layer on the selected portion of the substrate and a first resonator of a second stack on the substrate, respectively, such that the first resonators of the first and second stacks are distanced; forming an air cavity underlying the second stack; performing a first measurement on the second stack; trimming a top electrode of the first resonator of the first stack according to the first measurement; forming a decoupler on the first resonator of each of the first and second stacks, respectively; forming a second resonator on the decoupler of each of the first and second stacks, respectively; performing a second measurement on the first stack or the second stack; and trimming the top electrode of the second resonator of the first stack according to the second measurement, so as to achieve a desired device performance.

In one embodiment, the method further includes the steps of forming a passivation layer on the top electrode of the second resonators of the first and second stacks. The method may also include the steps of trimming the passivation layer according to the second measurement.

In addition, the method includes the step of removing the first sacrificial layer to form a cavity underlying the first stack after the step of forming the second resonator of the first stack.

In one embodiment, the step of forming the first and second resonators of the first stack further comprises the steps of trimming the bottom electrode and/or the piezoelectric layer.

In one embodiment, the step of forming the air cavity underlying the second stack comprises the step of etching the substrate from the backside of the substrate. In another embodiment, the step of forming the air cavity underlying the second stack comprises the step of etching the substrate from the front side of the substrate. In yet another embodiment, the step of forming the air cavity underlying the second stack comprises the step of forming a second sacrificial layer on or in the substrate such that the second stack is located over the second sacrificial layer. In one embodiment, the step of forming the air cavity underlying the second stack comprises the steps of etching the substrate from the backside of the substrate; and removing the second sacrificial layer. In another embodiment, the step of forming the air cavity underlying the second stack comprises the step of removing the second sacrificial layer from the front side of the substrate.

In one embodiment, the first measurement determines a resonant frequency of the first resonator of the second stack, and wherein the second measurement involves resonating the first and second resonators and determines an electrical response of the first and/or second stack. In another embodiment, the first measurement determines the thickness of one or more layers of the first resonator of the second stack, and wherein the second measurement determines the thickness of one or more layers of the second resonator of the first and/or second stack.

In another aspect, the present invention relates a method for manufacturing an acoustically coupled device comprising a stack having a first resonator, a second resonator and a decoupler formed between the first resonator and the second resonator, each of the first and second resonators having a piezoelectric layer sandwiched between a bottom electrode and a top electrode.

In one embodiment, the method includes the steps of providing a substrate having a first sacrificial layer formed in or on a selected portion of the substrate; forming a first resonator of a first stack over the sacrificial layer on the selected portion of the substrate and a first resonator of a second stack on the substrate, respectively, such that the first resonators of the first and second stacks are distanced; forming a gap underlying the second stack; performing a measurement on the second stack; trimming the top electrode of the first resonator of the first stack; and forming a second resonator over each of the first and second stacks, respectively.

In one embodiment, the method further includes the step of forming a decoupler on the first resonator of each of the first stack and the second stack, respectively, wherein the decoupler comprises at least one layer; measuring the thickness of the at least one layer of the decoupler; and trimming the decoupler of the first stack according to the measured thickness.

Furthermore, the method includes the step of forming a passivation layer on the top electrode of the second resonator of the first stack.

Moreover, the method includes the steps of performing a second measurement on the first stack or the second stack; and trimming the top electrode or the passivation layer of the second resonator of the first stack according to the second measurement, so as to achieve a desired device performance.

In addition, the method also includes the step of removing the first sacrificial layer to form a cavity underlying the first stack.

In one embodiment, the step of forming the air cavity underlying the second stack comprises the step of etching the substrate from the backside of the substrate. In another embodiment, the step of forming the air cavity underlying the second stack comprises the step of etching the substrate from the front side of the substrate. In yet another embodiment, the step of forming the air cavity underlying the second stack comprises the step of forming a second sacrificial layer on or in the substrate such that the second stack is located over the second sacrificial layer. In one embodiment, the step of forming the air cavity underlying the second stack comprises the steps of etching the substrate from the backside of the substrate; and removing the second sacrificial layer. In another embodiment, the step of forming the air cavity underlying the second stack comprises the step of removing the second sacrificial layer from the front side of the substrate.

In one embodiment, the first measurement determines a resonant frequency of the first resonator of the second stack, and wherein the second measurement involves resonating the first and second resonators and determines an electrical response of the first and/or second stack. In another embodiment, the first measurement determines the thickness of one or more layers of the first resonator of the second stack, and wherein the second measurement determines the thickness of one or more layers of the second resonator of the first and/or second stack.

In yet another aspect, the present invention relates a method of manufacturing an acoustically coupled device. In one embodiment, the method includes the steps of providing a substrate; forming a sacrificial layer in or on a selected portion of the substrate; forming a first resonator on the sacrificial layer such that the first resonator has an edge portion extending onto the substrate; trimming the first resonator to a targeted frequency value within a desired tolerance; forming an acoustic decoupler on the first resonator; forming a second resonator on the acoustic decoupler; removing the sacrificial layer to form an air cavity beneath the bottom surface of the first resonator; and trimming the second resonator to achieve a desired device performance.

In one embodiment, the step of forming the first resonator comprises the steps of forming a first electrode over the sacrificial layer and extending onto the substrate; forming a first piezoelectric layer on the first electrode; and forming a second electrode on the first piezoelectric layer. The step of forming the second resonator comprises the steps of forming a third electrode on the acoustic decoupler; forming a second piezoelectric layer on the third electrode; and forming a fourth electrode on the second piezoelectric layer.

The method further includes the step of forming a passivation layer on the fourth electrode.

Additionally, prior to the step of trimming the first resonator, the method also includes the steps of forming an air cavity beneath a plurality of resonators on selected test regions of the substrate; measuring the resonant frequencies of the test resonators; and generating a frequency non-uniformity profile defining a plurality of locations at which the second electrode of the first resonator requires thickness adjustments.

In one embodiment, the step of forming the air cavity comprises the step of removing sacrificial layer from the front side of the substrate. In another embodiment, the step of forming the air cavity comprises the step of removing the substrate material from the front side of the substrate. In yet another embodiment, the step of forming the air cavity comprises the step of etching the substrate material from the back side of the substrate. In a further embodiment, the step of forming the air cavity comprises the steps of etching the substrate from the backside of the substrate; and removing the sacrificial layer.

In one embodiment, the step of trimming the first resonator comprises the step of altering the thicknesses of the second electrode to achieve the targeted frequency value within a desired tolerance.

In one embodiment, the method, prior to trimming the second resonator, further includes the step of performing a measurement on selected acoustically coupled devices, wherein the measurement determines an electrical response of the selected acoustically coupled device, where the step of trimming of the second resonator comprises the step of altering the thicknesses of the fourth electrode and/or the passivation layer of the second resonator to achieve desired filter characteristics.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIGS. 2B-2G show schematically cross sectional views of the CRF showing the fabricating processes of the CRF according to the first embodiment of present invention;

FIGS. 3B-3G show schematically cross sectional views of the CRF showing a fabricating processes of the CRF according to the second embodiment of present invention;

FIGS. 4B-4H show schematically a cross sectional view of the CRF showing a manufacturing process of the CRF according to the third embodiment of present invention;

FIGS. 5B-5G show schematically a cross sectional view of the CRF showing a manufacturing process of the CRF according to the fourth embodiment of present invention;

DETAILED DESCRIPTION OF THE INVENTION

Figure 1:
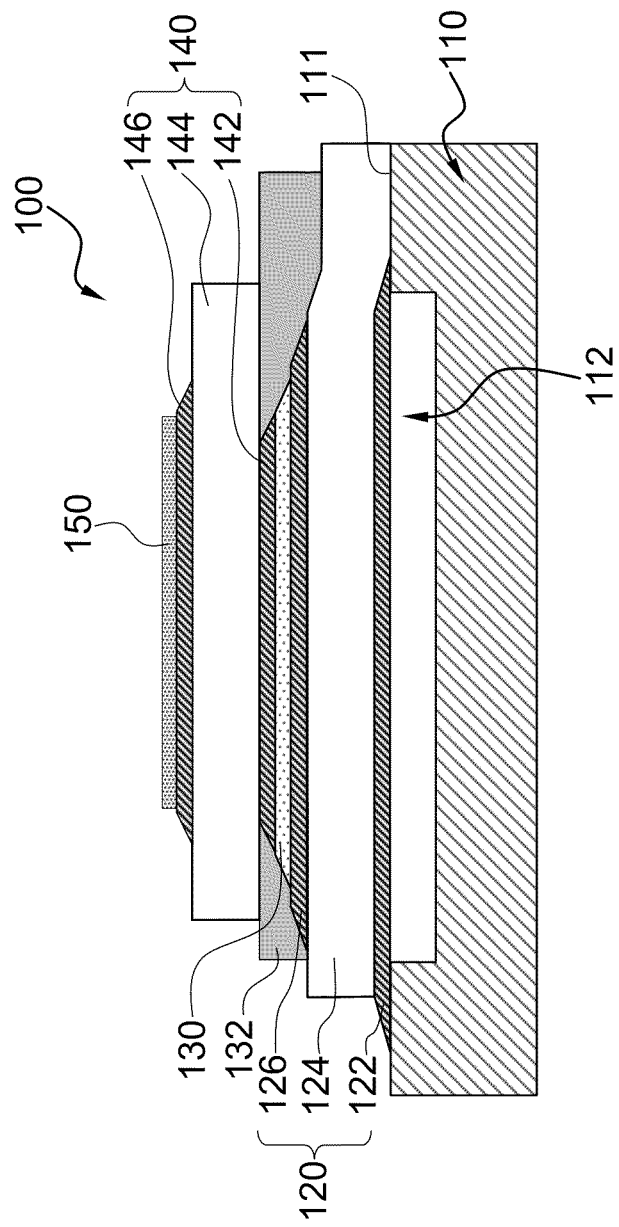
FIG. 1 shows schematically a cross sectional view of a coupled resonator filter (CRF)

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terms "film" and "layer", as used herein, are interchangeable and refer to a thin sheet of a material deposited or spread over a surface.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezo-active dielectric or used to perform special performance effects like temperature coefficient compensation or to facilitate manufacturing like adhesion layers. In addition, the other layers are typically thin when compared to the at least one layer exhibiting piezoelectric activity.

As used herein, the terms "fabricating process", "fabricating method", "manufacturing process", or "manufacturing method" are exchangeable, and refer to a process or method of making or producing an article or device, such as an acoustically coupled device, i.e., a coupled resonator filter.

As used herein, the terms "comprising," "including," "having," "containing," "involving," and the like are to be understood to be open-ended, i.e., to mean including but not limited to.

Hereinafter, the present invention will be described in more detail with reference to the accompanying drawings of FIGS. 1-8. In accordance with the purposes of this invention, as embodied and broadly described herein, this invention, in one aspect, relates to methods for manufacturing acoustically coupled devices. An example of the acoustically coupled device, coupled resonator filter (CRF), is described in following embodiments. In one embodiment, the CRF includes a bottom resonator and a top resonator stacked on and coupled to the bottom resonator. In practice, resonant frequencies of the two coupled resonators in the CRF have to be matched well to achieve optimal electrical response. For this reason, at lease two frequency correction steps (performed after deposition of the first and second top electrode, respectively) are used to compensate for inaccuracies, e.g., with respect to layer thickness in thin film deposition processes, according to embodiments of the present invention.

In one aspect of the present invention, methods for wafer level trimming of individual ones of a plurality of CRFs, so as to minimize a disparity between the exhibited filter characteristics, such as passband central frequency, bandwidth, and insertion loss, and a respective design target are disclosed. In the membrane type BAW filter case, air cavity has to be formed underneath a plurality of representative first resonators across wafer before coupling layer deposition and the second resonator building. Thus, the resonant frequency of these released resonators can be electrically measured. Based on this measured frequency distribution data, other un-released resonators' resonant frequency can be tuned (e.g., remove material by ion milling) within a certain target before fabricating the second resonator. This approach minimizes any process interaction or contamination induced by the release process of the first resonator on the second resonator building and the whole device performance. The use of the invented method allows the manufacture of high quality CRFs in large numbers, providing a high yield. The embodiments of the present invention are particularly advantageous in a high volume market, such as, in the mobile phone market with CRF.

Referring to FIG. 1, the structure of a CRF 100 is shown schematically according to one embodiment of the present invention. The CRF 100 includes a bottom resonator 120, a decoupling layer 130, a dielectrical layer 132 and a top resonator 140. The bottom resonator 120 is formed on a substrate 110, such that a cavity 112 recessed from the top surface 111 of the substrate 110 is underlying the bottom resonator 120. The decoupling layer 130 and the dielectrical layer 132 are sandwiched between the bottom resonator 120 and the top resonator 140.

The bottom resonator 120 includes a first electrode 122, a piezoelectric layer 124 and a second electrode 126. The piezoelectric layer 124 is sandwiched between the first electrode 122 and the second electrode 126. The top resonator 140, similar to the bottom resonator 120 in structure, has a first electrode 142, a second electrode 146 and a piezoelectric layer 144 sandwiched between the first electrode 142 and the second electrode 146.

The CRF 100 further includes a passivation layer 150 formed on the second electrode 146 of the top resonator 140.

The first electrode 122, 142 and the second electrode 126, 146 are made of, for example, but not limited to, gold (Au), tungsten (W), molybdenum (Mo), platinum (Pt), ruthenium (Ru), iridium (Ir), titanium tungsten (TiW), aluminum (Al), or titanium (Ti).

The piezoelectric layers 124, 144 are made of, for example, but not limited to, aluminum nitride (AlN), zinc oxide (ZnO), lead zirconate titanate (PZT), quartz, lithium niobate ($LiNbO_3$), potassium niobate ($KNbO_3$), or lithium tantalate ($LiTaO_3$).

Figure 6:
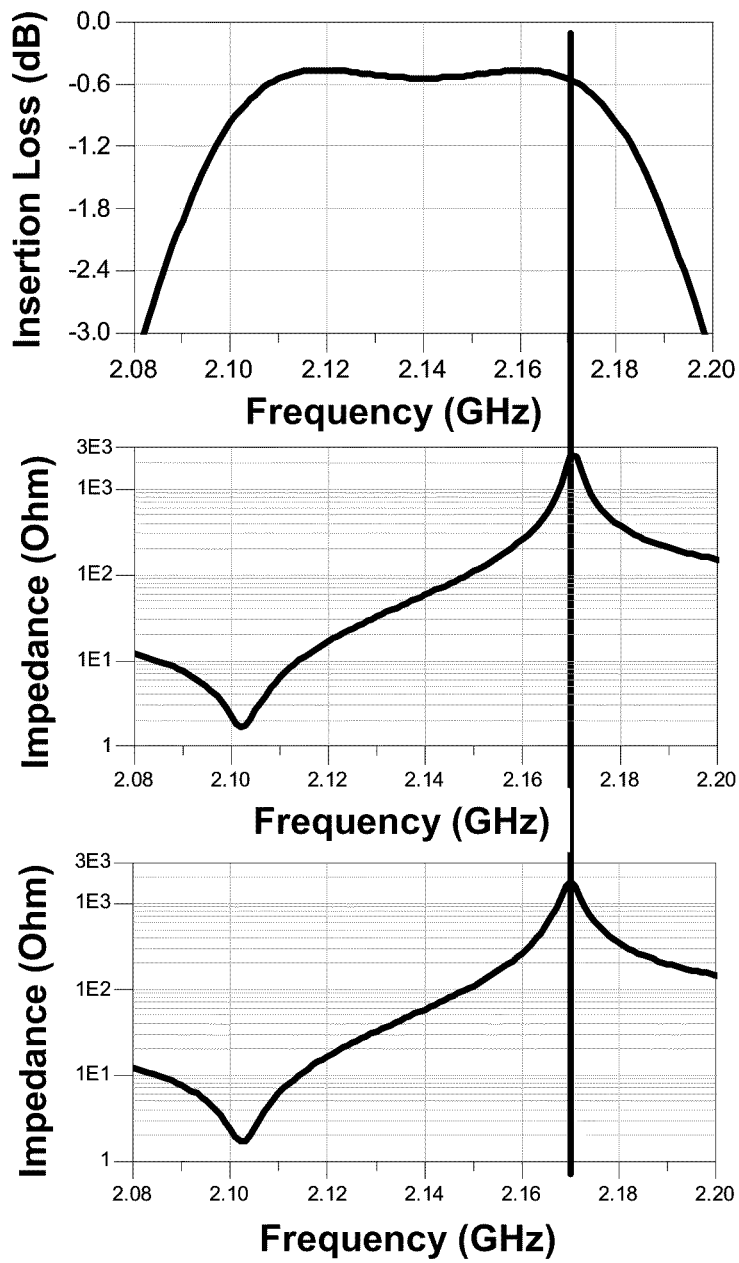
FIG. 6 shows experimental characteristics of a trimmed CRF according to one embodiment of the present invention.
Figure 7:
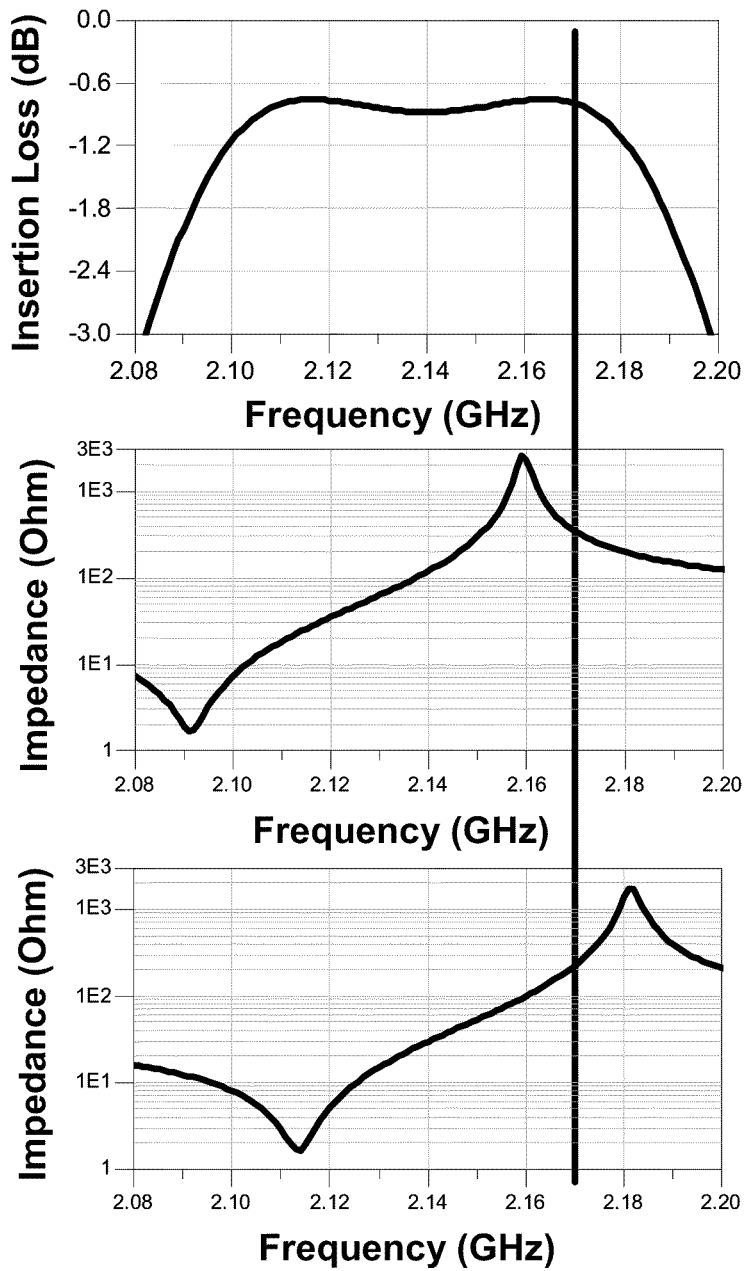
FIG. 7 and FIG. 8 show experimental characteristics of two untrimmed CRFs, where the resonant frequencies of the top and bottom resonators are mismatched.
Figure 8:
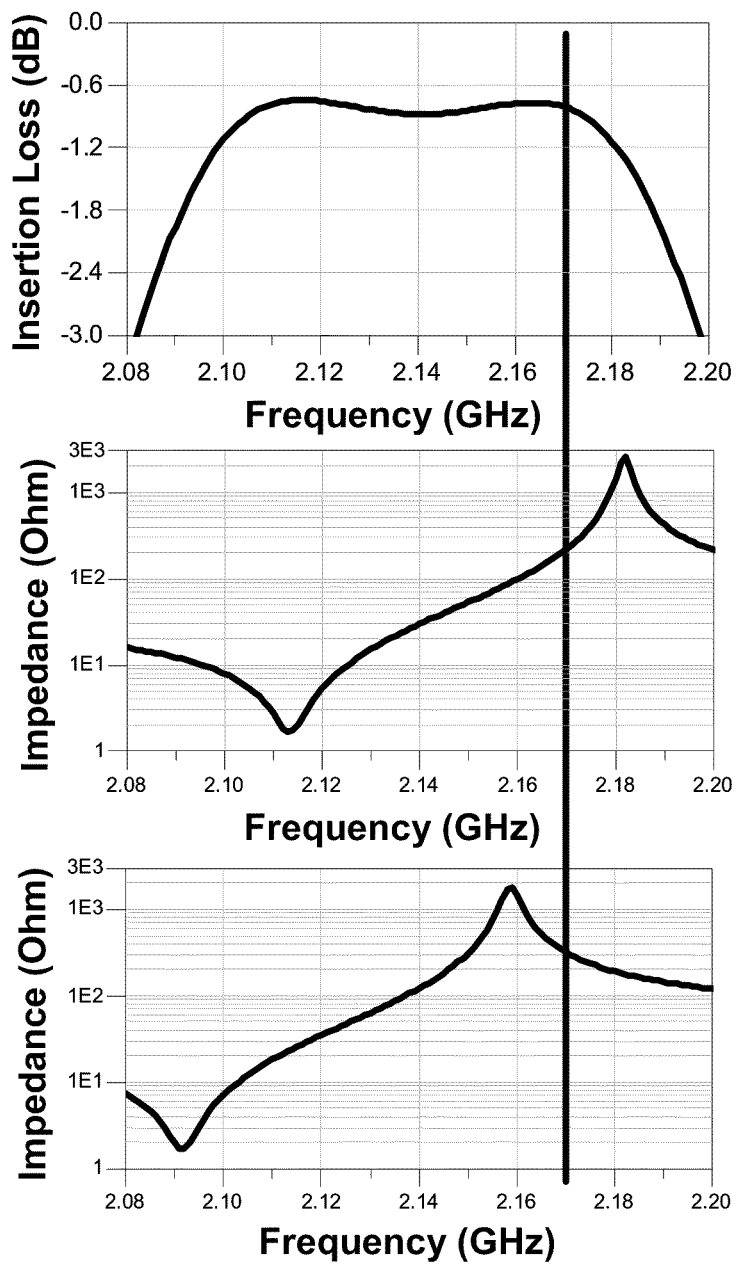

The performance of the CRF 100 is determined by resonant frequencies of the bottom and top resonators, and the thickness of each layer thereof. In order to achieve the tight tolerance in performance, the current invention provides a trimming process to be performed during manufacturing. Without any trimming, only a small number of CRFs across wafer can meet the required specification, and the manufacturing yield becomes low. Referring to FIG. 6, the transmission characteristics of a CRF having a 60 MHz wide pass band (2110-2170 MHz) is described in the top plot, and the impedance curves of the top and bottom resonator composing the CRF are shown in the middle and bottom plots, respectively. The position of the CRF pass band is predominantly determined by the resonant frequencies of the top and bottom resonators. When resonant frequencies of the top and bottom resonators are perfectly matched, the filter performance in the passband, in particular the transmission insertion loss is optimized. As shown in FIG. 7, when the resonant frequencies of the two resonators deviate from the original frequency (about 2170 MHz) by the same magnitude (i.e., 10 MHz) in an opposite direction, it is clear that the frequency mismatch causes degradation in the insertion loss and passband response of the filter, while the position of the right corner of the filter pass band is approximately unchanged (that is between the parallel resonant frequencies of the two resonators). Similar results are observed in FIG. 8. Any error on the resonant frequency of the bottom resonator has a direct impact on the passband insertion loss of the filter, therefore the bottom resonator of the CRF have to be trimmed to a desired frequency value before constructing the rest of the CRF stack. Correspondingly, the top resonator of the CRF should be trimmed to match its resonant frequency to that of the bottom resonator.

In one embodiment, the trimming process of a target CRF is performed based on the measurements to an additional, feedback CRF. During the manufacturing of the target CRF, the feedback CRF is fabricated nearby the target CRF in the same processes, so as enable that the target and feedback CRFs are structurally and functional identical or very similar to each other. Meanwhile, the measurements of the feedback CRF are performed at each formation of the bottom and top resonators. The measurements include, but not limited to, resonant frequencies of each of the bottom and top resonators, and/or the thickness of each layer of the bottom and top resonators. As disclosed below, the target CRF includes a first stack, while the feedback CRF includes a second stack.

Figure 2A:
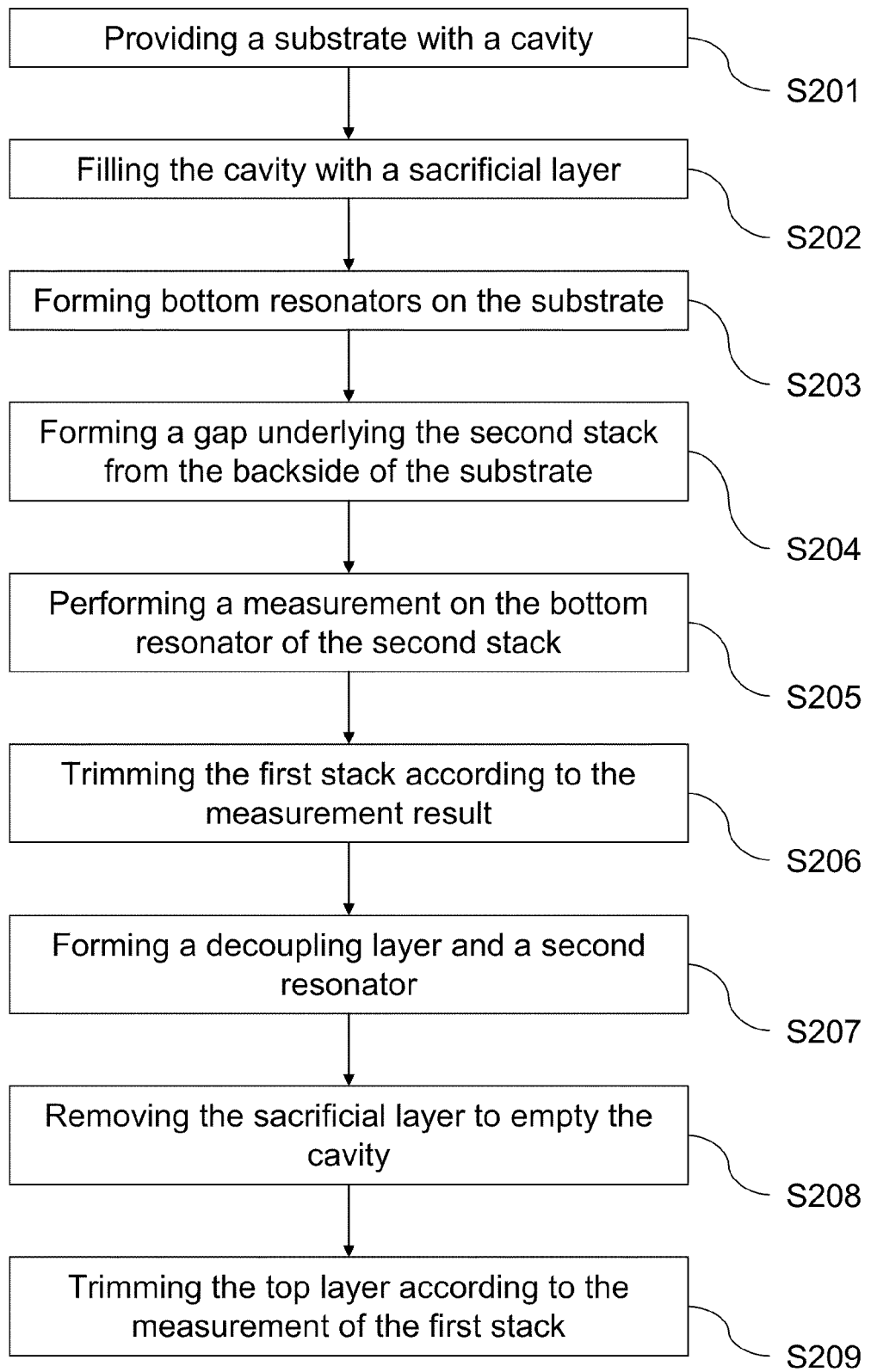
FIG. 2A shows schematically a flowchart of fabricating processes of a CRF according to a first embodiment of present invention.

Referring to FIGS. 2A-2G, a sequential process for manufacturing a CRF is shown according to the first embodiment of the present invention. FIG. 2A shows the flowchart of manufacturing the CRF of the first embodiment and FIGS. 2B-2G show the structural view of the CRF during manufacturing process.

First, at the step S201, a substrate 210 with a cavity 212 recessed from its top surface 211 is provided, as shown in FIG. 2B. The substrate 210 can be etched to form the cavity 212 with a predetermined pattern on its top surface 211.

Next, at the step S202, the cavity 212 is filled with a sacrificial layer 214, as shown in FIG. 2C. Specifically, the sacrificial layer 214, such as silicon oxide, polysilicon, metal, polymer, may be deposited in the cavity 212 by a sputtering process, a CVD process, a PVD process, spin coating, or other appropriate process.

At the step S203, the bottom resonator 220a of the first stack 200a and the bottom resonator 220b of the second stack 200b are formed on the substrate 210, as shown in FIG. 2D. Specifically, a first electrode 222a of a first stack 200a is formed on the sacrificial layer 214 and a first electrode 222b of a second stack 200b is formed on the top surface 211 by, for example, deposition process. The first electrode 222a and the first electrode 222b are apart from each other by an appropriate distance. Then, a piezoelectric layer 224a is deposited on the first electrode 222a, and another piezoelectric layer 224b is deposited on the first electrode 222b. A trimming process to adapt the thickness is preferably performed on the first electrode 222a and 222b and/or the piezoelectric layer 224a and 224b to reduce the non-uniformity in thickness during manufacturing. Afterwards, a second electrode 226a is deposited on the piezoelectric layer 224a and a second electrode 226b is deposited on the piezoelectric layer 224b so as to respectively form the bottom resonator 220a of the first stack 200a and the bottom resonator 220b of the second stack 200b.

At the step S204 and as shown in FIG. 2E, a gap 216 underlying the first electrode 222b of the second stack 200b is formed from the backside 215 of the substrate 210 by a suitable etch process, such as a dry etch process.

Then, at the step S205, a measurement of the second stack 200b is performed for estimating the resonating frequency and the thickness.

Subsequently, at the step S206, a trimming process is performed on the first stack 200a according to the measurement result. For example, after a resonating frequency of the second stack 200b is determined by the measurement, a target thickness of the second electrode 226a can be calculated based on the resonating frequency of the second stack 200b. Then, a trimming process is performed by adjusting a pre-trimmed thickness of the second electrode 226a to the target thickness. If the pre-trimmed thickness of the second electrode 226a is greater than the target thickness, an ion beam milling process, for example, is used to reduce the thickness of the second electrode 226a. If the pre-trimmed thickness of the second electrode 226a is smaller than the target thickness, a deposition means, for example, is used to increase the thickness of the second electrode 226a.

Next, the remaining part of the first stack 200a is formed on the bottom resonator 220a. At the step 207 and as shown in FIG. 2F, a dielectric layer 232a and a decoupling layer 230a are deposited on the second electrode 226a by using, for example, a CVD process. Then, a trimming is preferably performed to adjust the thickness of the decoupling layer 230a to a target thickness, which is determined according to, for example, a pre-determined bandwidth. Next, the top resonator 240a, comprising the first electrode 242a, piezoelectric layer 244a and the second electrode 246a, is deposited on the decoupling layer 230a.

In this embodiment, the remaining part of the second stack 200b (a decoupling layer 230b, a dielectric layer 232b and a top resonator 240b) may also be formed on the bottom resonator 220b accompanying the formation of the decoupling layer 230a, the dielectric layer 232a and the top resonator 240a, so that the remaining part of the second stack 200b can be measured to provide a trimming goal for another trimming of the remaining part of the first stack 200a.

Then, at the step S208 and as shown in FIG. 2G, in order to form membrane type resonator structure, the cavity 212 is emptied by using an etching means to remove the sacrificial layer 214 so as to prevent the acoustic wave from propagating into the substrate 210.

At this time, the first stack 200a can be considered as a CRF, but the resonating frequency of this CRF may be still inaccurate. At the step S209, in order to enhance the performance, a further trimming process on the top layer of the CRF may be performed according to a measurement of the first stack 200a. The thickness of the second electrode 246a can be adjusted according to a predetermined filter characteristic. Preferably, a passivation layer (not shown) may be deposited on the second electrode 246a. The passivation layer also can be trimmed according to the predetermined filter characteristics.

Although this embodiment only describes there are two stacks on a substrate, in yet another embodiment, more than two stacks can be formed on a large substrate, such as a wafer. According to the essence of above embodiment, a gap can be formed underlying one of these stacks. A measurement to this stack above the gap can be performed, and a trimming target of others stacks can be calculated based on a result of the measurement. Then, all of the remaining stacks will be trimmed simultaneously.

Figure 3A:
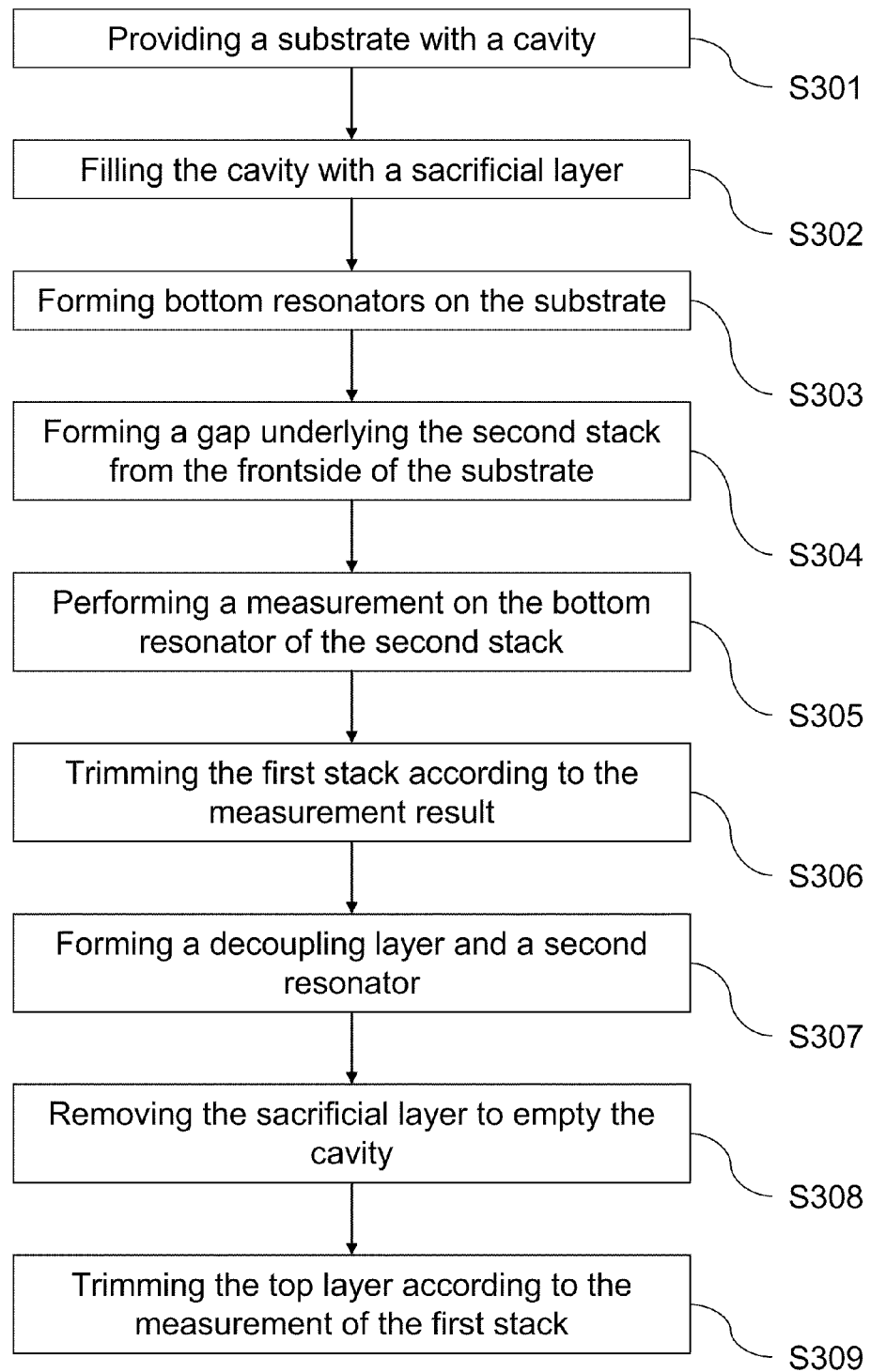
FIG. 3A shows schematically a flowchart of fabricating processes of a CRF according to a second embodiment of present invention.

Referring to FIGS. 3A-3G, a sequential process for producing a CRF is shown according to the second embodiment of the present invention. FIG. 3A shows the flowchart of the CRF of the second embodiment and FIGS. 3B-3G show the structural view of the CRF during manufacturing process.

First, at the step S301, a substrate 310 with a cavity 312 is provided, as shown in FIG. 3B. The substrate 310 can be etched to form the cavity 312 with a predetermined pattern on its top surface 311.

Next, at the step S302, the cavity 312 is filled with a sacrificial layer 314, as shown in FIG. 3C. Specifically, the sacrificial layer 314, such as silicon oxide, polysilicon, metal, polymer, etc, may be deposited in the cavity 312 by a sputtering process, a CVD process, a PVD process, spin coating, or other appropriate process.

At the step S303, the bottom resonator 320a of the first stack 300a and the bottom resonator 320b of the second stack 300b are formed on the substrate 310, as shown in FIG. 3D. Specifically, a first electrode 322a of a first stack 300a is formed on the sacrificial layer 314 and a first electrode 322b of a second stack 300b is formed on the top surface 311 by, for example, deposition process. The first electrode 322a and the first electrode 322b are apart from each other by an appropriate distance. Then, a piezoelectric layer 324a is deposited on the first electrode 322a, and another piezoelectric layer 324b is deposited on the first electrode 322b. A trimming process to adapt the thickness is preferably performed on the first electrode 322a and 322b and/or the piezoelectric layer 324a and 324b to reduce the non-uniformity in thickness during manufacturing. Afterwards, a second electrode 326a is deposited on the piezoelectric layer 324a and a second electrode 326b is deposited on the piezoelectric layer 324b so as to respectively form the bottom resonator 320a of the first stack 300a and the bottom resonator 320b of the second stack 300b.

At the step S304 and as shown in FIG. 3E, a gap 316 underlying the first electrode 322b of the second stack 300b is formed from the top surface 311 of the substrate 310 by, for example, isotropic etching process.

Then, at the step S305, a measurement of the second stack 300b is performed for estimating the resonating frequency and the thickness.

Subsequently, at the step S306, a trimming process is performed on the first stack 300a according to the measurement result. For example, after a resonant frequency of the second stack 300b is determined by the measurement, a target thickness of the second electrode 326a can be calculated based on the resonant frequency of the second stack 300b. Then, a trimming process is performed by adjusting a pre-trimmed thickness of the second electrode 326a to the target thickness. If the pre-trimmed thickness of the second electrode 326a is greater than the target thickness, an ion beam milling process, for example, is used to reduce the thickness of the second electrode 326a. If the pre-trimmed thickness of the second electrode 326a is smaller than the target thickness, a deposition means, for example, is used to increase the thickness of the second electrode 326a.

Next, the remaining part of the first stack 300a is formed on the bottom resonator 320a. At the step 307 and as shown in FIG. 3F, a dielectric layer 332a and a decoupling layer 330a are deposited on the second electrode 326a by using, for example, a CVD process. Then, a trimming is preferably performed to adjust the thickness of the decoupling layer 330a to a target thickness, which is determined according to, for example, a pre-determined bandwidth. Next, the top resonator 340a, comprising the first electrode 342a, piezoelectric layer 344a and the second electrode 346a, is deposited on the decoupling layer 330a.

In this embodiment, the remaining part of the second stack 300b (a decoupling layer 330b, a dielectric layer 332b and a top resonator 340b) may also be formed on the bottom resonator 320b accompanying the formation of the decoupling layer 330a, the dielectric layer 332a and the top resonator 340a, so that the remaining part of the second stack 300b can be measured to provide a trimming goal for another trimming of the remaining part of the first stack 300a.

Then, at the step S308, in order to form membrane type resonator structure, the cavity 312 is emptied by using an etching means to remove the first sacrificial layer 314 so as to prevent the acoustic wave from propagating into the substrate 310, as shown in FIG. 3G.

At this time, the first stack 300a can be considered as a CRF, but the resonant frequency of this CRF may be still inaccurate. At the step S309, in order to enhance the performance, a further trimming process may be performed. The thickness of the second electrode 346a can be adjusted according to a predetermined filter characteristic. Preferably, a passivation layer (not shown) may be deposited on the second electrode 346a. The passivation layer also can be trimmed according to the predetermined filter characteristics.

Although this embodiment only describes there are two stacks on a substrate, in yet another embodiment, more than two stacks can be formed on a large substrate, such as a wafer. According to the essence of above embodiment, a gap can be formed underlying one of these stacks. A measurement to this stack can be performed, and a trimming target of others stacks can be calculated based on a result of the measurement. Then, all of the remaining stacks will be trimmed simultaneously.

Figure 4A:
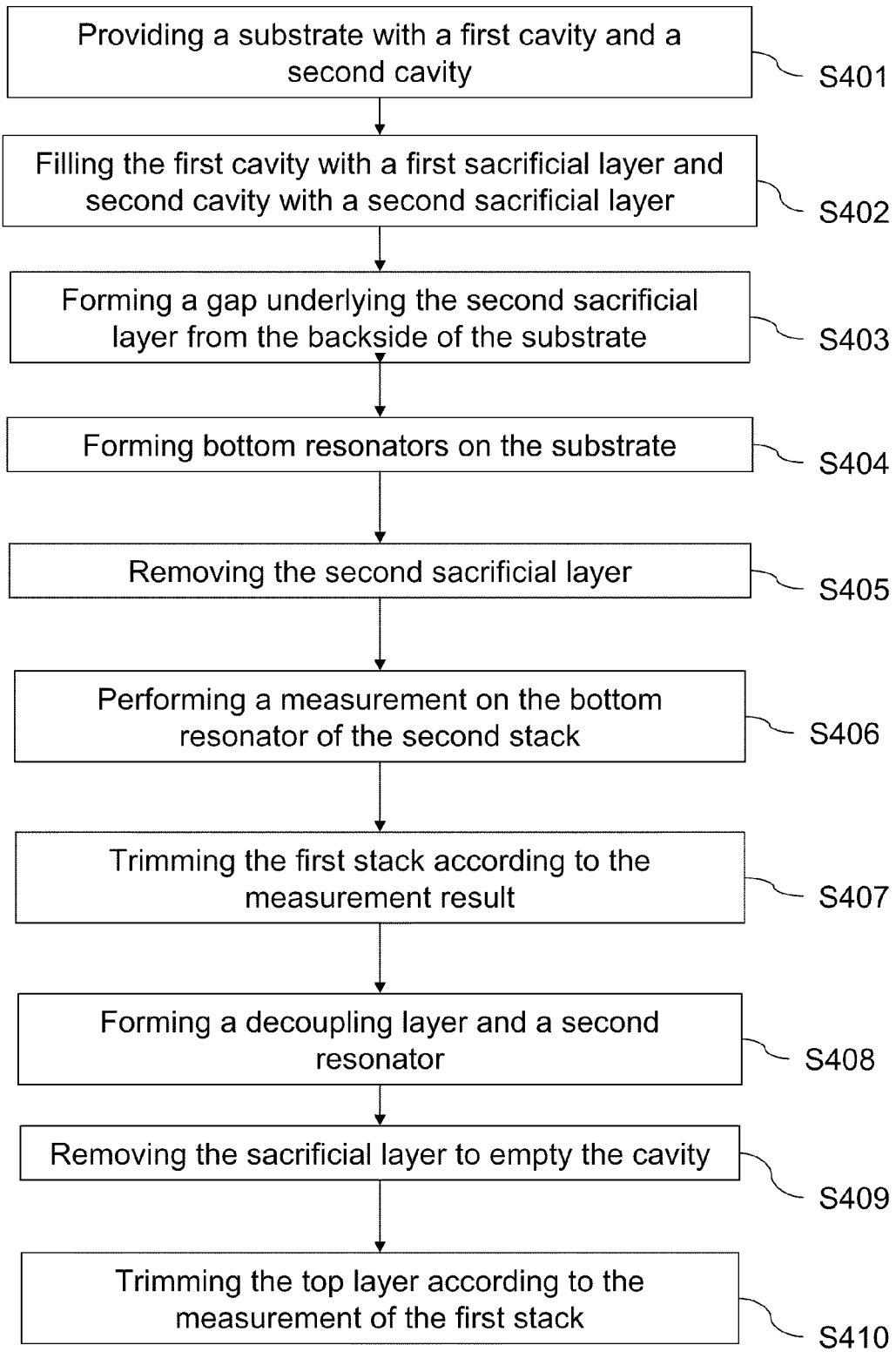
FIG. 4A shows schematically a flowchart of the manufacturing process of a CRF according to the third embodiment of present invention.

Referring to FIGS. 4A-4H, a sequential process for producing a CRF is shown according to the third embodiment of the present invention. FIG. 4A shows the flowchart of the CRF of the third embodiment and FIGS. 4B-4H show the structural view of the CRF during manufacturing process.

First, at the step S401, a substrate 410 with a first cavity 412 and a second cavity 418 on its top surface 411 is provided, in FIG. 4B. The substrate 410 can be etched to form the first cavity 412 and second cavity 418 with predetermined patterns on its top surface 411.

Next, at the step S402, the first cavity 412 is filled with a first sacrificial layer 414, and the second cavity 418 is filled with a second sacrificial layer 419, in FIG. 4C. Specifically, the first sacrificial layer 414, such as silicon oxide, polysilicon, metal, polymer, may be deposited in the first cavity 412 by a sputtering process, a CVD process, a PVD process, spin coating, or other appropriate process. The second sacrificial layer 419 is also deposited in the second cavity 418 by the same way.

At the step S403, a gap 416 underlying the second sacrificial layer 419 is formed from the backside 415 of the substrate 410 by, for example, wet etching process, as shown in FIG. 4D.

At the step S404, the bottom resonator 420a of the first stack 400a and the bottom resonator 420b of the second stack 400b are formed on the substrate 410 as shown in FIG. 4E. Specifically, a first electrode 422a of a first stack 400a is formed on the first sacrificial layer 414 and a first electrode 422b of a second stack 400b is formed on the second sacrificial layer 419 by, for example, deposition process. Then, a piezoelectric layer 424a is deposited on the first electrode 422a, and another piezoelectric layer 424b is deposited on the first electrode 422b. A trimming process to adapt the thickness is preferably performed on the first electrode 422a and 422b and/or the piezoelectric layer 424a and 424b to reduce the non-uniformity in thickness during manufacturing. Afterwards, a second electrode 426a is deposited on the piezoelectric layer 424a and a second electrode 426b is deposited on the piezoelectric layer 424b.

Although as shown in FIG. 4D (Step S403) and FIG. 4E (Step S404), the etching process to form the gap 416 is prior to the deposition process of the bottom resonator 420a/420b. The etching process and the deposition process can be swapped. That is to say, the deposition process can be prior to the etching process.

At the step S405, the second sacrificial layer 419 is removed to communicate the second cavity 418 with the gap 416, as shown in FIG. 4F.

Then, at the step S406, a measurement of the second stack 400b is performed for estimating the resonant frequency and the thickness.

Subsequently, at the step S407, a trimming process is performed on the first stack 400a according to the measurement result. For example, after a resonant frequency of the second stack 400b is determined by the measurement, a target thickness of the second electrode 426a can be calculated based on the resonant frequency of the second stack 400b. Then, a trimming process is performed by adjusting a pre-trimmed thickness of the second electrode 426a to the target thickness. If the pre-trimmed thickness of the second electrode 426a is greater than the target thickness, an ion beam milling process, for example, is used to reduce the thickness of the second electrode 426a. If the pre-trimmed thickness of the second electrode 426a is smaller than the target thickness, a deposition means, for example, is used to increase the thickness of the second electrode 426a.

Next, the remaining part of the first stack 400a is formed on the bottom resonator 420a. At the step S408, a dielectric layer 432a and a decoupling layer 430a are deposited on the second electrode 426a by using, for example, a CVD process, as shown in FIG. 4G. Then, a trimming is preferably performed to adjust the thickness of the decoupling layer 430a to a target thickness, which is determined according to, for example, a pre-determined bandwidth. Next, the top resonator 440a, comprising the first electrode 442a, piezoelectric layer 444a and the second electrode 446a, is deposited on the decoupling layer 430a.

In this embodiment, the remaining part of the second stack 400b (a decoupling layer 430b, a dielectric layer 432b and a top resonator 440b) may also be formed on the bottom resonator 420b accompanying the formation of the decoupling layer 430a, the dielectric layer 432a and the top resonator 440a, so that the remaining part of the second stack 400b can be measured to provide a trimming goal for another trimming of the remaining part of the first stack 400a.

Then, at the step S409 shown in FIG. 4H, in order to form membrane type resonator structure, a cavity 412 is emptied by using an etching means to remove the first sacrificial layer 414 so as to prevent the acoustic wave from propagating into the substrate 410.

At this time, the first stack 400a can be considered as a CRF, but the resonant frequency of this CRF may be still inaccurate. At the step S410, in order to enhance the performance, a further trimming process may be performed. The thickness of the second electrode 446a can be adjusted according to a predetermined filter characteristic. Preferably, a passivation layer (not shown) may be deposited on the second electrode 446a. The passivation layer also can be trimmed according to the predetermined filter characteristics.

Although this embodiment only describes there are two stacks on a substrate, in yet another embodiment, more than two stacks can be formed on a large substrate, such as a wafer. According to the essence of above embodiment, a gap can be formed underlying one of these stacks. A measurement to this stack can be performed, and a trimming target of others stacks can be calculated based on a result of the measurement. Then, all of the remaining stacks will be trimmed simultaneously.

Figure 5A:
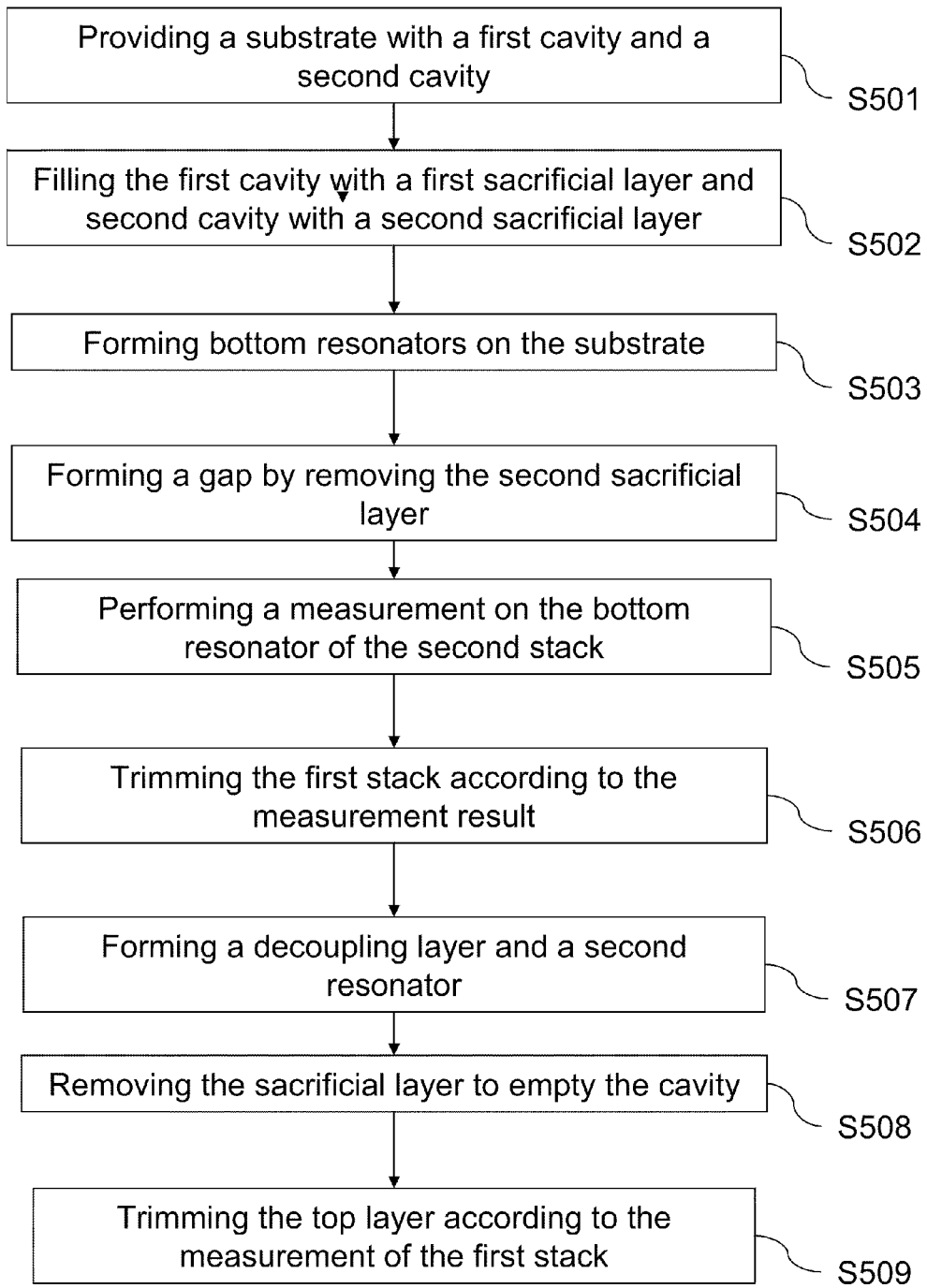
FIG. 5A shows schematically a flowchart of the manufacturing process of a CRF according to the fourth embodiment of present invention.

Referring to FIGS. 5A-5G, a sequential process for producing a CRF is shown according to the fourth embodiment of the present invention. FIG. 5A shows the flowchart of the CRF of the fourth embodiment and FIGS. 5B-5G show the structural view of the CRF during manufacturing process.

First, at the step S501, a substrate 510 with a first cavity 512 and a second cavity 518 on its top surface 511 is provided as shown in FIG. 5B. The substrate 510 can be etched to form the first cavity 512 and second cavity 518 with predetermined patterns on its top surface 511.

Next, at the step S502, the first cavity 512 is filled with a first sacrificial layer 514, and the second cavity 518 is filled with a second sacrificial layer 519, as shown in FIG. 5C. Specifically, the first sacrificial layer 514, such as silicon oxide, polysilicon, metal, polymer, is deposited in the first cavity 512 by a sputtering process, a CVD process, a PVD process, spin coating, or other appropriate process. The second sacrificial layer 519 is also deposited in the second cavity 518 by the same way.

At the step S503, the bottom resonator 520a of the first stack 500a and the bottom resonator 520b of the second stack 500b are formed on the substrate 510, as shown in FIG. 5D. Specifically, a first electrode 522a of a first stack 500a is formed on the first sacrificial layer 514 and a first electrode 522b of a second stack 500b is formed on the second sacrificial layer 519 by, for example, deposition process. Then, a piezoelectric layer 524a is deposited on the first electrode 522a, and another piezoelectric layer 524b is deposited on the first electrode 522b. A trimming process to adapt the thickness is preferably performed on the first electrode 522a and 522b and/or the piezoelectric layer 524a and 524b to reduce the non-uniformity in thickness during manufacturing. Afterwards, a second electrode 526a is deposited on the piezoelectric layer 524a and a second electrode 526b is deposited on the piezoelectric layer 524b.

At the step S504, the second sacrificial layer 519 is removed to form the gap 516 from the front side of the substrate, as shown in FIG. 5E.

Then, at the step S505, a measurement of the second stack 500b is performed for estimating the resonant frequency and the thickness.

Subsequently, at the step S506, a trimming process is performed on the first stack 500a according to the measurement result. For example, after a resonant frequency of the second stack 500b is determined by the measurement, a target thickness of the second electrode 526a can be calculated based on the resonant frequency of the second stack 500b. Then, a trimming process is performed by adjusting a pre-trimmed thickness of the second electrode 526a to the target thickness. If the pre-trimmed thickness of the second electrode 526a is greater than the target thickness, an ion beam milling process, for example, is used to reduce the thickness of the second electrode 526a. If the pre-trimmed thickness of the second electrode 526a is smaller than the target thickness, a deposition means, for example, is used to increase the thickness of the second electrode 526a.

Next, the remaining part of the first stack 500a is formed on the bottom resonator 520a. At the step S507 and as shown in FIG. 5F, a dielectric layer 532a and a decoupling layer 530a are deposited on the second electrode 526a by using, for example, a CVD process. Then, a trimming is preferably performed to adjust the thickness of the decoupling layer 530a to a target thickness, which is determined according to, for example, a pre-determined bandwidth. Next, the top resonator 540a, comprising the first electrode 542a, piezoelectric layer 544a and the second electrode 546a, is deposited on the decoupling layer 530a.

In this embodiment, the remaining part of the second stack 500b (a decoupling layer 530b, a dielectric layer 532b and a top resonator 540b) may also be formed on the bottom resonator 520b accompanying the formation of the decoupling layer 530a, the dielectric layer 532a and the top resonator 540a, so that the remaining part of the second stack 500b can be measured to provide a trimming goal for another trimming of the remaining part of the first stack 500a.

Then, at the step S508, in order to form membrane type resonator structure, the cavity 512 is emptied by using an etching means to remove the first sacrificial layer 514 so as to prevent the acoustic wave from propagating into the substrate 510, as shown in FIG. 5G.

At this time, the first stack 500a can be considered as a CRF, but the resonating frequency of this CRF may be still inaccurate. At the step S509, in order to enhance the performance, a further trimming process may be performed. The thickness of the second electrode 546a can be adjusted according to a predetermined filter characteristic. Preferably, a passivation layer (not shown) may be deposited on the second electrode 546a. The passivation layer also can be trimmed according to the predetermined filter characteristics.

Although this embodiment only describes there are two stacks on a substrate, in yet another embodiment, more than two stacks can be formed on a large substrate, such as a wafer. According to the essence of above embodiment, a gap can be formed underlying one of these stacks. A measurement to this stack can be performed, and a trimming target of others stacks can be calculated based on a result of the measurement. Then, all of the remaining stacks will be trimmed simultaneously.

The present invention, among other things, recites a method to perform wafer level trimming of individual ones of a plurality of CRFs, to minimize a disparity between the exhibited filter characteristics, such as passband central frequency, bandwidth, and insertion loss, and a respective design target. In the membrane type BAW filter case, air cavity has to be formed underneath a plurality of representative first resonators across wafer before coupling layer deposition and the second resonator building. Thus, resonant frequency of these released resonators can be electrically measured. Based on this measured frequency distribution data, other un-released resonators' resonant frequency can be tuned, e.g., by removing material by ion milling, within a certain target before constructing the second resonator. This approach minimizes any process interaction or contamination induced by the release process of the first resonator on the second resonator building and the whole device performance. The use of this method allows the manufacture of high quality CRFs in large numbers, providing a high yield. The embodiments of the present invention are particularly advantageous in a high volume market, such as, is the case in the mobile phone market with CRF.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for manufacturing an acoustically coupled device comprising a stack having a first resonator, a second resonator and a decoupler, the decoupler formed between the first resonator and the second resonator, each of the first and second resonators having a piezoelectric layer sandwiched between a bottom electrode and a top electrode, the method comprising the steps of:
   (a) providing a substrate having a first sacrificial layer formed in or on a selected portion of the substrate;
   (b) forming the first resonator of a first stack over the sacrificial layer on the selected portion of the substrate and the first resonator of a second stack on the substrate, respectively, such that the first resonators of the first and second stacks are distanced;
   (c) forming an air cavity underlying the second stack;
   (d) performing a first measurement on the second stack;
   (e) trimming a top electrode of the first resonator of the first stack according to the first measurement;
   (f) forming the decoupler on the first resonator of each of the first and second stacks, respectively;
   (g) forming the second resonator on the decoupler of each of the first and second stacks, respectively;
   (h) performing a second measurement on the first stack or the second stack; and
   (i) trimming the top electrode of the second resonator of the first stack according to the second measurement, so as to achieve a desired device performance.

2. The method of claim 1, further comprising the step of forming a passivation layer on the top electrode of the second resonator of the first and second stacks.

3. The method of claim 2, further comprising the step of trimming the passivation layer according to the second measurement.

4. The method of claim 1, further comprising the step of removing the first sacrificial layer to form a cavity underlying the first stack after the step of forming the second resonator of the first stack.

5. The method of claim 1, wherein the step of forming the first and second resonators of the first stack further comprises the steps of trimming the bottom electrode and/or the piezoelectric layer.

6. The method of claim 1, wherein the step of forming the air cavity underlying the second stack comprises the step of etching the substrate from the backside of the substrate.

7. The method of claim 1, wherein the step of forming the air cavity underlying the second stack comprises the step of etching the substrate from the front side of the substrate.

8. The method of claim 1, wherein the step of forming the air cavity underlying the second stack comprises the step of forming a second sacrificial layer on or in the substrate such that the second stack is located over the second sacrificial layer.

9. The method of claim 8, wherein the step of forming the air cavity underlying the second stack comprises the steps of:
   (a) etching the substrate from the backside of the substrate; and
   (b) removing the second sacrificial layer.

10. The method of claim 8, wherein the step of forming the air cavity underlying the second stack comprises the step of removing the second sacrificial layer from the front side of the substrate.

11. The method of claim 1, wherein the first measurement determines a resonant frequency of the first resonator of the second stack, and wherein the second measurement involves resonating the first and second resonators and determines an electrical response of the first and/or second stack.

12. The method of claim 1, wherein the first measurement determines the thickness of one or more layers of the first resonator of the second stack, and wherein the second measurement determines the thickness of one or more layers of the second resonator of the first and/or second stack.

13. A method for manufacturing an acoustically coupled device comprising a stack having a first resonator, a second resonator and a decoupler, the decoupler formed between the first resonator and the second resonator, each of the first and second resonators having a piezoelectric layer sandwiched between a bottom electrode and a top electrode, the method comprising the steps of:
   (a) providing a substrate having a first sacrificial layer formed in or on a selected portion of the substrate;
   (b) forming the first resonator of a first stack over the sacrificial layer on the selected portion of the substrate and the first resonator of a second stack on the substrate, respectively, such that the first resonators of the first and second stacks are distanced;
   (c) forming a gap underlying the second stack;
   (d) performing a measurement on the second stack;
   (e) trimming the top electrode of the first resonator of the first stack; and
   (f) forming the second resonator over each of the first and second stacks, respectively.

14. The method of claim 13, further comprising the steps of:
   (a) forming a decoupler on the first resonator of each of the first stack and the second stack, respectively, wherein the decoupler comprises at least one layer;
   (b) measuring the thickness of the at least one layer of the decoupler; and
   (c) trimming the decoupler of the first stack according to the measured thickness.

15. The method of claim 14, further comprising the step of forming a passivation layer on the top electrode of the second resonator of the first stack.

16. The method of claim 15, further comprising the steps of:
   (a) performing a second measurement on the first stack or the second stack; and
   (b) trimming the top electrode or the passivation layer of the second resonator of the first stack according to the second measurement, so as to achieve a desired device performance.

17. The method of claim 13 further comprising the step of removing the first sacrificial layer to form a cavity underlying the first stack.

18. The method of claim 13, wherein the step of forming the air cavity underlying the second stack comprises the step of etching the substrate from the backside of the substrate.

19. The method of claim 13, wherein the step of forming the air cavity underlying the second stack comprises the step of etching the substrate from the front side of the substrate.

20. The method of claim 13, wherein the step of forming the air cavity underlying the second stack comprises the step of forming a second sacrificial layer on or in the substrate such that the second stack is located over the second sacrificial layer.

21. The method of claim 20, wherein the step of forming the air cavity underlying the second stack comprises the steps of:
   (a) etching the substrate from the backside of the substrate; and
   (b) removing the second sacrificial layer.

22. The method of claim 20, wherein the step of forming the air cavity underlying the second stack comprises the step of removing the second sacrificial layer from the front side of the substrate.

23. The method of claim 16, wherein the first measurement determines a resonant frequency of the first resonator of the second stack, and wherein the second measurement measures an electrical response of the second stack.

24. The method of claim 16, wherein the first measurement determines the thickness of one or more layers of the first resonator of the second stack, and wherein the second measurement determines the thickness of one or more layers of the second resonator of the second stack.

* * * * *